United States Patent
Lin et al.

(10) Patent No.: US 10,217,403 B2
(45) Date of Patent: Feb. 26, 2019

(54) DISPLAY APPARATUS

(71) Applicant: Innolux Corporation, Miao-Li County (TW)

(72) Inventors: Chun-Hsien Lin, Miao-Li (TW);
Chih-Yung Hsieh, Miao-Li (TW);
Tsau-Hua Hsieh, Miao-Li (TW);
Shu-Ming Kuo, Miao-Li (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/597,149

(22) Filed: May 16, 2017

(65) Prior Publication Data

US 2017/0337870 A1 Nov. 23, 2017

Related U.S. Application Data

(60) Provisional application No. 62/339,107, filed on May 20, 2016, provisional application No. 62/350,169, filed on Jun. 14, 2016.

(30) Foreign Application Priority Data

Dec. 21, 2016 (CN) .......................... 2016 1 1189564

(51) Int. Cl.
*H01L 33/58* (2010.01)
*G09G 3/32* (2016.01)
*G09G 3/20* (2006.01)
*H01L 27/12* (2006.01)
*H01L 25/075* (2006.01)
(Continued)

(52) U.S. Cl.
CPC ............. *G09G 3/32* (2013.01); *G09G 3/2003* (2013.01); *H01L 25/0753* (2013.01); *H01L 27/124* (2013.01); *H01L 33/62* (2013.01);
*G09G 2300/0426* (2013.01); *G09G 2300/0452* (2013.01); *G09G 2300/0456* (2013.01); *G09G 2300/0809* (2013.01);
(Continued)

(58) Field of Classification Search
CPC ................... G09G 3/32; G09G 3/2003; G09G 2300/0452; G09G 2320/0233; G09G 2300/0456; G09G 2300/0426; G09G 2300/0809; H01L 27/124; H01L 25/167; H01L 33/60; H01L 33/42; H01L 33/62; H01L 25/0753
USPC ...................................................... 257/98, 99
See application file for complete search history.

(56) References Cited

U.S. PATENT DOCUMENTS

2017/0133357 A1* 5/2017 Kuo ...................... H01L 25/167

* cited by examiner

*Primary Examiner* — Selim Ahmed
(74) *Attorney, Agent, or Firm* — JCIPRNET

(57) ABSTRACT

The disclosure provides a display apparatus. The display apparatus of the disclosure includes a substrate having a plurality of pixel regions, a plurality of active elements, a plurality of first signal lines and second signal lines, a plurality of ground signal lines and a plurality of light emitting diodes (LEDs). The plurality of ground signal lines are disposed on the substrate and arranged to alternate with the first signal lines. At least one LED has first and second electrodes. The first electrode of at least one LED is electrically connected with a corresponding active element. A second electrode of at least one LED is electrically connected with a corresponding ground signal line. At least two LEDs disposed in an identical pixel region is electrically connected with an identical ground signal line between two first signal lines adjacent to each other. The display apparatus of the disclosure has high resolution.

9 Claims, 18 Drawing Sheets

(51) Int. Cl.
    *H01L 33/62* (2010.01)
    *H01L 33/42* (2010.01)
(52) U.S. Cl.
    CPC ...... *G09G 2320/0233* (2013.01); *H01L 33/42* (2013.01); *H01L 33/58* (2013.01)

DISPLAY APPARATUS

CROSS-REFERENCE TO RELATED APPLICATION

This application claims the priority benefits of U.S. provisional application Ser. No. 62/339,107, filed on May 20, 2016, U.S. provisional application Ser. No. 62/350,169, filed on Jun. 14, 2016, and China application serial no. 201611189564.X, filed on Dec. 21, 2016. The entirety of each of the above-mentioned patent applications is hereby incorporated by reference herein and made a part of this specification.

BACKGROUND OF THE DISCLOSURE

Field of the Disclosure

The disclosure relates to a display, and particularly to a display apparatus utilizing a micro light emitting diode (LED).

Description of Related Art

With the characteristics of light emitting diode (LED), a display apparatus that utilizes a micro LED has the advantages of low power consumption, high brightness, color saturation, fast responding speed and power saving. Moreover, the display apparatus is superior in material stability and non-image sticking. Accordingly, the display technology of display apparatus that utilizes micro LED display receives considerable attention in the field. Specifically, it is an important issue to find out how to improve the resolution of the display apparatus that utilizes micro LED display.

The display apparatus includes a substrate and a plurality of LEDs disposed on an active device substrate. The active device substrate has a reflective structure such as active element, scan line, data line, capacitor electrode and so on. Under the condition of light irradiation from an outer environment, the reflective structure of the active device substrate reflects the light from the outer environment. The reflected light from the outer environment interferes with the light emitted by the LED chip and affects the display effect. Therefore, it is also an important issue in the field of display apparatus to explore how to improve the display effect affected by the light from the outer environment.

SUMMARY OF THE DISCLOSURE

The disclosure provides a display apparatus having high resolution.

The disclosure provides a display apparatus having an excellent display effect.

The display apparatus of the disclosure includes a substrate, a plurality of active elements, a plurality of first signal lines, a plurality of second signal lines, a plurality of ground signal lines and a plurality of light emitting diodes (LEDs). The substrate has a plurality of pixel regions. The plurality of active elements are disposed on the substrate. The plurality of first signal lines and the plurality of second signal lines are disposed on the substrate and electrically connected with the active elements. An extension direction of at least one first signal line is different from an extension direction of at least one second signal line. The plurality of ground signal lines are disposed on the substrate and arranged to be alternated with the first signal line. The plurality of LEDs are disposed on the substrate. At least one LED has a first electrode and a second electrode. The first electrode of at least one LED is electrically connected with a corresponding active element. The second electrode of at least one LED is electrically connected with a corresponding ground signal line. At least two LEDs disposed in the same pixel region are electrically connected with the same ground signal line between two first signal lines adjacent to each other.

In the disclosure, the display apparatus includes a substrate, a plurality of LEDs, a first insulation layer and an anti-reflection conductive layer. The substrate has a plurality of sub-pixel regions and a plurality of reflective structures disposed in the plurality of pixel regions. The plurality of LEDs are disposed on the plurality of pixel regions and electrically connected with the substrate. The first insulation layer is filled between the plurality of LEDs. The anti-reflection conductive layer is disposed on the first insulation layer. The reflectivity of the anti-reflection conductive layer is lower than the reflectivity of the reflective structure. The anti-reflection conductive layer blocks the reflective structure of the substrate and has a plurality of openings. The openings expose a light emitting region of the LED.

Based on the above, in the display apparatus according to one embodiment of the disclosure, at least two LEDs disposed in the same pixel region are electrically connected to the same ground signal line between two first signal lines adjacent to each other. Accordingly, the area of the substrate of the display apparatus can be used efficiently, thereby realizing the display apparatus having high resolution.

In another embodiment of the disclosure, a display apparatus includes an anti-reflection conductive layer. The reflectivity of the anti-reflection conductive layer is lower than the reflectivity of the reflective structure of the active device substrate of the display apparatus. The anti-reflection conductive layer blocks the reflective structure of the substrate. Since the anti-reflection conductive layer blocks the reflective structure of the substrate, most of the light from the outer environment irradiating to the display apparatus is blocked by the anti-reflection conductive layer and cannot be not easily reflected by the reflective structure of the substrate having high reflectivity. As a result, little amount of light from the outer environment is reflected, such that it is not easy to interfere with the light emitted by the micro LED of the display apparatus viewed by the user, thereby enhancing the display effect of the display apparatus. The micro LED (for example having an area less than 100 microns square or having an area small enough that it is not visible to an unaided observer of the display at a designed viewing distance) is known.

In order to make the aforementioned features and advantages of the disclosure more comprehensible, embodiments accompanying figures are described in detail below.

DESCRIPTION OF EMBODIMENTS

Figure 1:
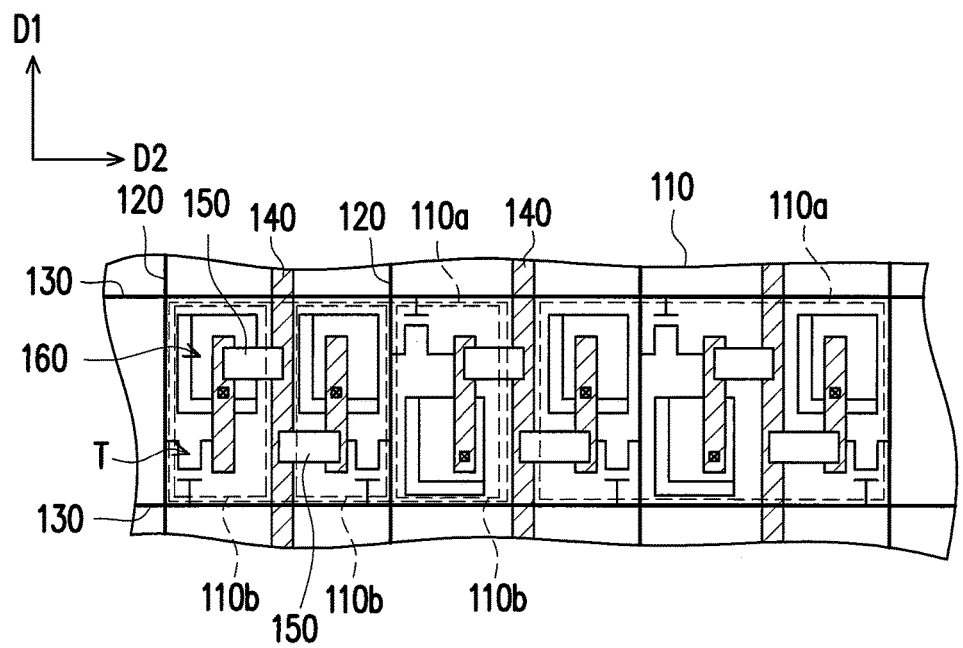
FIG. 1 is a top view of a display apparatus according to an embodiment of the disclosure.

FIG. 1 is a top view of a display apparatus according to an embodiment of the disclosure. Referring to FIG. 1, a display apparatus 100 includes a substrate 110, a plurality of active elements T, a plurality of first signal lines 120, a plurality of second signal lines 130, a plurality of ground signal lines 140 and a plurality of light emitting diodes (LEDs) 150. The substrate 110 has a plurality of pixel regions 110a. In the embodiment, each pixel region 110a may be defined by the first signal line 120, the ground signal line 140 (e.g. the second ground signal line 140 counted from the left side of FIG. 1) corresponding to the first signal line 120 and two second signal lines 130 adjacent to each other. Each pixel region 110a includes a plurality of sub-pixel regions 110b. Each sub-pixel region 110b may be defined by the first signal line 120, the ground signal line 140 adjacent to the first signal line 120 and two second signal lines 130 adjacent to each other, which should not be construed as a limitation to the disclosure. In other embodiments, the pixel region 110a and/or sub-pixel region 110b may be defined by other suitable components. In the embodiment, the plurality of sub-pixel regions 110b in the same pixel region 110a may exhibit different colors (e.g. color of red, green and blue). Via color-mixing in the plurality of sub-pixel regions 110b in the same pixel region 110a, the same pixel region 110a can exhibit a designated color, which enables the display apparatus 100 to display a colored frame, which should not be construed as a limitation the disclosure. It depends on actual requirement to determine whether or not the plurality of sub-pixel regions 110b in the same pixel region 110a need to exhibit different colors respectively.

The plurality of active elements T are disposed on the substrate 110. The plurality of first signal lines 120 and the plurality of second signal lines 130 are disposed on the substrate 110 and electrically connected to the plurality of active elements T. An extension direction D1 of each first signal line 120 is different from an extension direction D2 of each second signal line 130. In the embodiment, the first signal line 120 and second signal line 130 may respectively belong to different film layers, and the first signal line 120 and the second signal line 130 may be arranged to cross each other. The active element T includes a thin film transistor. The thin film transistor has a gate, a source and a drain. In the embodiment, the first signal line 120 may be electrically connected with the source of the thin film transistor. The second signal line 130 may be electrically connected with the gate of the thin film transistor. In other words, in the embodiment, the first signal line 120 may be a data line, and the second signal line 130 may be a scan line, which should not be construed as a limitation to the disclosure.

The plurality of ground signal lines 140 are disposed on the substrate 110 and arranged to be alternated with the first signal line 120. Each ground signal line 140 is disposed between two first signal lines 120 adjacent to each other. In the embodiment, the first signal line 120, the second signal line 130 and the ground signal line 140 may respectively belong to three different film layers. An orthogonal projection of each ground signal line 140 on the substrate 110 is between two orthogonal projections of two first signal lines 120 adjacent to each other on the substrate 110. In the embodiment, the display apparatus 100 may further include a plurality of storage capacitors 160. Each storage capacitor 160 is electrically connected with a corresponding active element T respectively.

Figure 2:
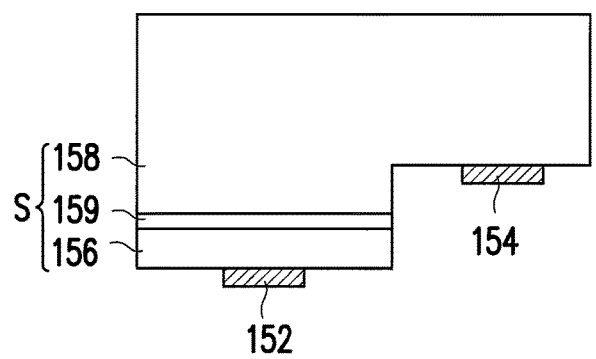
FIG. 2 is a cross-sectional view of an LED according to an embodiment of the disclosure.

FIG. 2 is a cross-sectional view of an LED according to an embodiment of the disclosure. Referring to FIGS. 1 and 2, the plurality of LEDs 150 are disposed on the substrate 110. Each LED 150 has a first electrode 152 and a second electrode 154. The first electrode 152 of each LED 150 is electrically connected with a corresponding active element T. The second electrode 154 of each LED 150 is electrically connected with a corresponding ground signal line 140. Referring to FIG. 2, the LED 150 includes a first semiconductor structure 156 electrically connected with the first electrode 152, a second semiconductor structure 158 electrically connected with the second electrode 154 and a light emitting layer 159 disposed between the first semiconductor structure 156 and the second semiconductor structure 158. The first semiconductor structure 156, the second semiconductor structure 158 and the light emitting layer 159 may be regarded as a semiconductor structure S as a whole. In the embodiment, the first electrode 152 and the second electrode 154 may be disposed on the same side of the semiconductor structure S. In other words, the LED 150 may be a horizontal LED which is electrically connected with the corresponding active element T and ground signal line 140 in the manner of flip chip.

It should be noted that the second electrode 154 of at least two LEDs 150 in the same pixel region 110a is electrically connected with the same ground signal line 140 between two first signal lines 120 adjacent to each other. In other words, in the embodiment, the two LEDs 150 which are respectively disposed in two sub-pixel regions 110b adjacent to each other may share the same ground signal line 140. Thus, the number of required ground signal line 140 can be reduced, so that the display apparatus 100 having high resolution can be realized accordingly.

As shown in FIG. 1, in the embodiment, the plurality of LEDs 150 disposed in the same pixel region 110a and electrically connected with the same ground signal line 140 may be disposed respectively on different sides of the same ground signal line 140. To be specific, in the embodiment, the plurality of LEDs 150 disposed in the same pixel region 110a and electrically connected with the same grounds signal line 140 may be staggered to each other. As a result, the area of substrate 110 can be used efficiently so that the resolution of the display apparatus 100 can be further enhanced.

Figure 3:
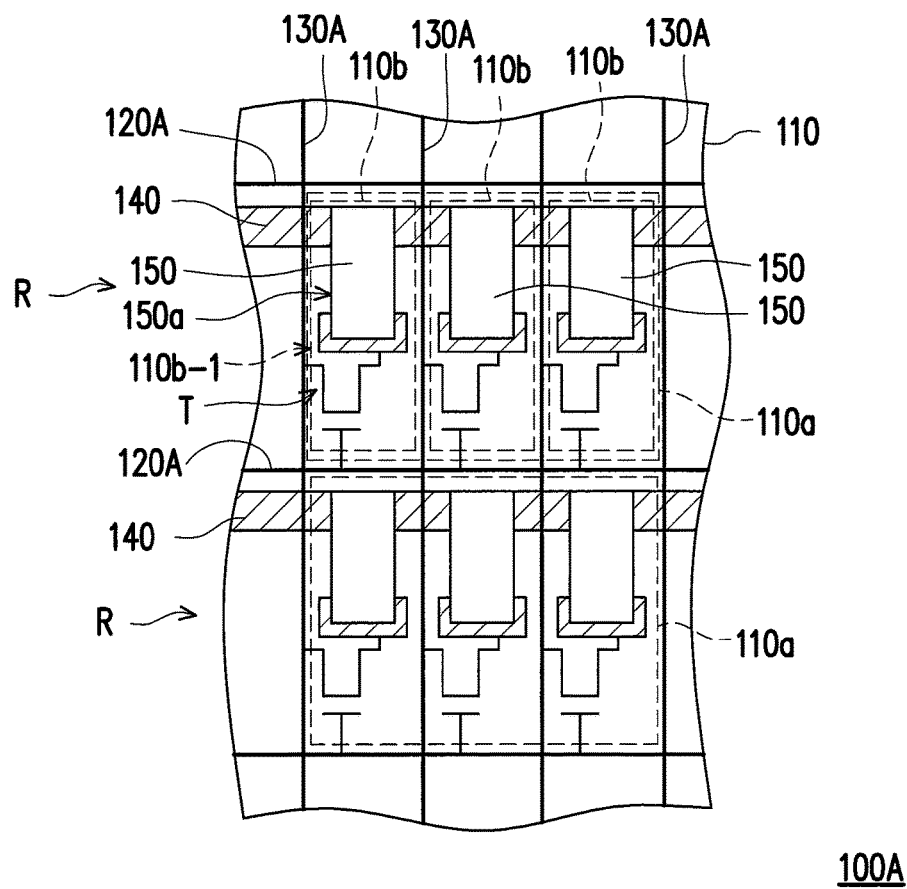
FIG. 3 is a top view of a display apparatus according to another embodiment of the disclosure.

FIG. 3 is a top view of a display apparatus according to another embodiment of the disclosure. A display apparatus 100A in FIG. 3 is similar to the display apparatus 100 in FIG. 1; therefore, identical or corresponding components are denoted by identical or corresponding reference numerals. Referring to FIG. 3, the display apparatus 100A includes the substrate 110, the plurality of active elements T, a plurality of first signal lines 120A, a plurality of second signal lines 130A, the plurality of ground signal lines 140 and the plurality of LEDs 150. The substrate 110 has the plurality of pixel regions 110a. In the embodiment, each pixel region 110a may be defined by two first signal lines 120A adjacent to each other and corresponding two second signal lines 130A (e.g. the first second signal line 130A and the fourth second signal line 130A counted from the left side of FIG. 3). Each pixel region 110a includes the plurality of sub-pixel regions 110b. Each sub-pixel region 110b may be defined by two first signal lines 120A adjacent to each other and two second signal lines 130A adjacent to each other, which should not be construed as a limitation to the disclosure.

The plurality of active elements T are disposed on the substrate 110. The plurality of first signal lines 120A and the plurality of second signal lines 130A are disposed on the substrate 110 and electrically connected with the plurality of active elements T. The extension direction D1 of each first signal line 120A is different from the extension direction of each second signal line 130A. The active element T includes a thin film transistor. The thin film transistor has a gate, a source and a drain. The difference between the display apparatus 100A and display apparatus 100 is that, in the embodiment, the first signal line 120A is electrically connected with the gate of the thin film transistor. The second signal line 130A is electrically connected with the source of the thin film transistor. That is to say, in the embodiment, the first signal line 120A may be a scan line, and the second signal line 130A may be data line, which should not be construed as a limitation to the disclosure.

Referring to FIG. 3, the plurality of ground signal lines 140 are disposed on the substrate 110 and arranged to alternate with the first signal line 120A. Referring to FIGS. 2 and 3, the plurality of LEDs 150 are disposed on the substrate 110. Each LED 150 has the first electrode 152 and the second electrode 154. The first electrode 152 of each LED 150 is electrically connected with a corresponding active element T. The second electrode 154 of each LED 150 is electrically connected with a corresponding ground signal line 140. At least two LEDs 150 disposed in the same pixel region 110a are electrically connected with the same ground signal line 140 between two first signal lines 120A adjacent to each other.

Referring to FIG. 3, the difference between the display apparatus 100A and display apparatus 100 is that, in the embodiment, the plurality of LEDs 150 disposed in the same pixel region 110a and electrically connected with the same ground signal line 140 are disposed on the same side of the ground signal line 140. To be specific, in the embodiment, the plurality of LEDs 150 may be arranged in a plurality of rows R, and the plurality of LEDs 150 disposed on the same row R may be electrically connected with the same ground signal line 140. In addition, it should be noted that, in the embodiment, the LED 150 may have a long side 150a. The sub-pixel region 110b may be formed in a rectangular shape. The long side 150a of the LED 150 may be substantially parallel with a long side 110b-1 of the sub-pixel region 110b. Accordingly, the area of the substrate 110 may be used more efficiently so that the resolution of display apparatus 100A may be further enhanced.

Figure 4:
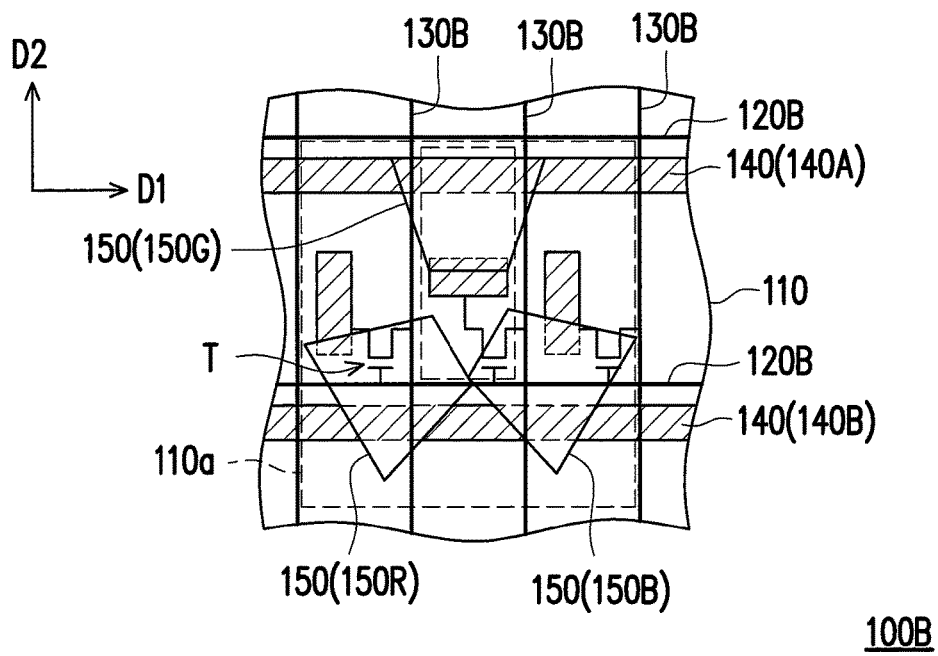
FIG. 4 is a top view of a display apparatus according to yet another embodiment of the disclosure.

A display apparatus 100B in FIG. 4 is similar to the display apparatus 100 in FIG. 1; therefore, identical or corresponding components are denoted by identical or corresponding reference numerals. Referring to FIG. 4, the display apparatus 100B includes the substrate 110, the plurality of active elements T, a plurality of first signal lines 120B, a plurality of second signal lines 130B, the plurality of ground signal lines 140 and the plurality of LEDs 150. The substrate 110 has the plurality of pixel regions 110a. Each pixel region 110a includes a plurality of sub-pixel regions 110b. In the embodiment, each pixel region 110a may be defined by two first signal lines 120B adjacent to each other and two second signal lines 130B adjacent to each other, which should not be construed as a limitation to the disclosure.

The plurality of active elements T are disposed on the substrate 110. The plurality of first signal lines 120B and the plurality of second signal lines 130B are disposed on the substrate 110 and electrically connected with the plurality of active elements T. The extension direction D1 of each first signal line 120B is different from the extension direction D2 of each second signal line 130B. The active element T includes a thin film transistor. The thin film transistor has a gate, a source and a drain. In the embodiment, the first signal line 120B is electrically connected with the gate of the thin film transistor. The second signal line 130B is electrically connected with the source of the thin film transistor. That is to say, in the embodiment, the first signal line 120B may be a scan line, and the second signal line 130B may be a data line, which should not be construed as a limitation to the disclosure.

Referring to FIG. 4, the plurality of ground signal lines 140 are disposed on the substrate 110 and arranged to alternate with the first signal line 120B. Referring to FIGS. 2 and 4, the plurality of LEDs 150 are disposed on the substrate 110. Each LED 150 has the first electrode 152 and the second electrode 154. The first electrode 152 of each LED 150 is electrically connected with a corresponding active element T. The second electrode 154 of each LED 150 is electrically connected with a corresponding ground signal line 140. The second electrode 154 of at least two LEDs 150 disposed in the same pixel region 110a are electrically connected with the same ground signal line 140 between two first signal lines 120B adjacent to each other.

Referring to FIG. 4, the difference between the display apparatus 100B and display apparatus 100 is that, in the embodiment, the plurality of LEDs 150 includes a first LED 150R, a second LED 150G and a third LED 150B that emit different color of light; at least a portion of the first LED 150R, at least a portion of the second LED 150G and at least a portion of the third LED 150B are disposed in the same sub-pixel region 110b. Accordingly, the area of the substrate 110 may be used more efficiently so that the resolution of display apparatus 100B may be further enhanced. In the embodiment, the first LED 150R, the second LED 150G and the third LED 150B respectively can emit light of red color, green color and blue color, which should not be construed as a limitation to the disclosure. The color of light emitted by the first LED 150R, second LED 150G and third LED 150B is subject to actual requirement. The ground signal line 140 includes a first ground signal line 140A and a second ground signal line 140B that are respectively disposed on two different sides of the same first signal line 120B (e.g. the first signal line 120B at the bottom of FIG. 4). The second electrode 154 of the first LED 150R is electrically connected with the first ground signal line 140A. The second electrode 154 of the second LED 150G and the second electrode 154 of the third LED 150B are electrically connected with the second ground signal line 140B.

Figure 5:
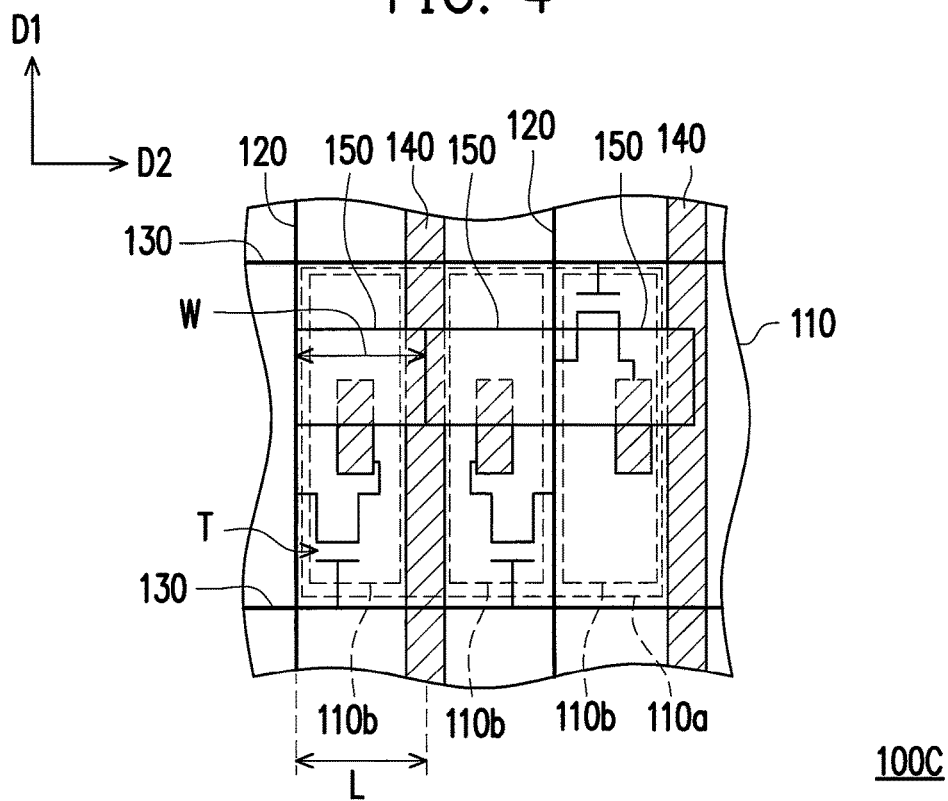
FIG. 5 is a top view of a display apparatus according to yet another embodiment of the disclosure.

FIG. 5 is a top view of a display apparatus according to yet another embodiment of the disclosure. A display apparatus 100C in FIG. 5 is similar to the display apparatus 100 in FIG. 1; therefore, identical or corresponding components are denoted by identical or corresponding reference numerals. Referring to FIG. 5, the display apparatus 100C includes the substrate 110, the plurality of active elements T, the plurality of first signal lines 120, the plurality of second signal lines 130, the plurality of ground signal lines 140 and the plurality of LEDs 150. The substrate 110 has the plurality of pixel regions 110a. The plurality of active elements T are disposed on the substrate 110. The plurality of first signal lines 120 and the plurality of second signal lines 130 are disposed on the substrate 110 and electrically connected with the plurality of active elements T. The extension direction D1 of each first signal line 120 is different from the extension direction D2 of each second signal line 130. The plurality of ground signal lines 140 are disposed on the substrate 110 and arranged to be alternated with the first signal line 120.

Referring to FIGS. 2 and 5, the plurality of LEDs 150 are disposed on the substrate 110. Each LED 150 has the first electrode 152 and the second electrode 154. The first electrode 152 of each LED 150 is electrically connected with a corresponding active element T. The second electrode 154 of each LED 150 is electrically connected with a corresponding ground signal line 140. At least two LEDs 150 disposed in the same pixel region 110a are electrically connected with the same ground signal line 140 between two first signal lines 120 adjacent to each other.

The difference between the display apparatus 100C and display apparatus 100 is that, in the embodiment, the plurality of LEDs 150 may be selectively aligned with each other. To be more specific, each LED 150 has a width W in the extension direction D2 of the second signal line 130, and the width W may be substantially equal to a distance L between the first signal line 120 to the ground signal line 140 that is the closest to the first signal line 120. Accordingly, the area of the substrate 110 may be used more efficiently so that the resolution of display apparatus 100C may be further enhanced.

Figure 6:
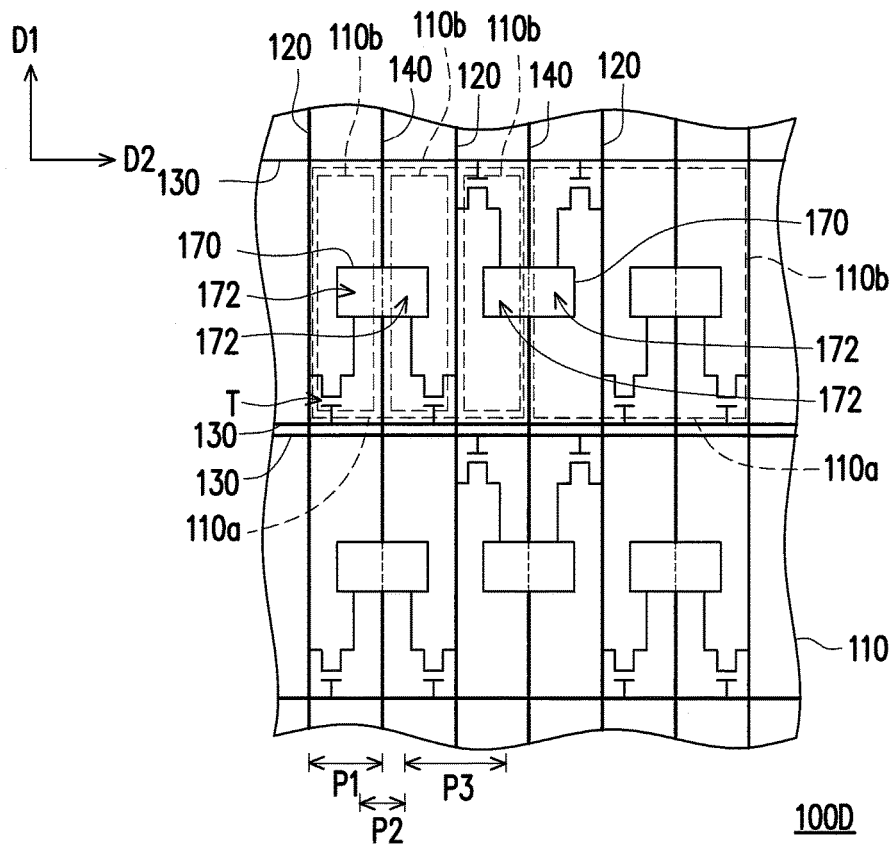
FIG. 6 is a top view of a display apparatus according to an embodiment of the disclosure.

FIG. 6 is a top view of a display apparatus according to an embodiment of the disclosure. A display apparatus 100D in FIG. 6 is similar to the display apparatus 100 in FIG. 1; therefore, identical or corresponding components are denoted by identical or corresponding reference numerals. The display apparatus 100D includes the substrate 110, the plurality of active elements T, the plurality of first signal lines 120, the plurality of second signal lines 130, the plurality of ground signal lines 140 and a plurality of LEDs 172. The substrate 110 has the plurality of pixel regions 110a. The plurality of active elements T are disposed on the substrate 110. The plurality of first signal lines 120 and the plurality of second signal lines 130 are disposed on the substrate 110 and electrically connected with the plurality of active elements T. The extension direction D1 of each first signal line 120 is different from the extension direction D2 of each second signal line 130. The plurality of ground signal lines 140 are disposed on the substrate 110 and arranged to be alternated with the first signal line 120.

Figure 7:
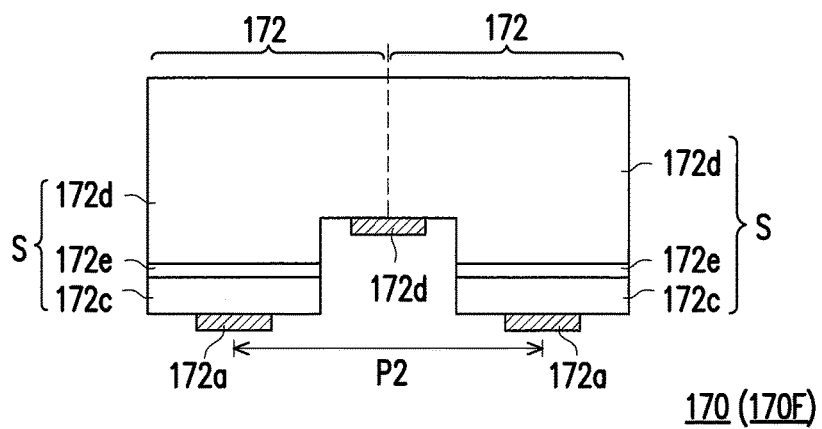
FIG. 7 is a cross-sectional view of an LED chip according to an embodiment of the disclosure.

FIG. 7 is a cross-sectional view of an LED chip according to an embodiment of the disclosure. Referring to FIGS. 6 and 7, the plurality of LEDs 172 are disposed on the substrate 110. Each LED 172 has a first electrode 172a and a second electrode 172b. The first electrode 172a of each LED 172 is electrically connected with a corresponding active element T. The second electrode 172b of each LED 172 is electrically connected with a corresponding ground signal line 140. Referring to FIG. 7, each LED 172 includes a first semiconductor structure 172c electrically connected with the first electrode 172a, a second semiconductor structure 172d electrically connected with the second electrode 172b and a light emitting layer 172e disposed between the first semiconductor structure 172c and the second semiconductor structure 172d. The first semiconductor structure 172c, the second semiconductor structure 172d and the light emitting layer 172e may be regarded as a semiconductor structure S as a whole. In the embodiment, the first electrode 172a and the second electrode 172b may be disposed on the same side of the semiconductor structure S. In other words, each LED 172 may be a horizontal LED which is electrically connected with the corresponding active element T and ground signal line 140 in the manner of flip chip.

Referring to FIGS. 6 and 7, the second electrode 172b of at least two LEDs 172 in the same pixel region 110a is electrically connected with the same ground signal line 140 between two first signal lines 120 adjacent to each other. The difference between the display apparatus 100D and display apparatus 100 is that, in the embodiment, the second semiconductor structures 172d of the plurality of LEDs 172 electrically connected to the same ground signal line 140 are in contact with each other and formed in the same semiconductor layer. In other words, the plurality of LEDs 172 electrically connected with the same ground signal line 140 are the same LED chip 170. The plurality of LEDs 172 electrically connected with the same ground signal line 140 are a plurality of portions of the same LED chip 170 and may share the same second electrode 172b. Thus, the area of the substrate 110 can be used more efficiently so that the resolution of the display apparatus 100D can be further enhanced.

Referring to FIG. 6, in the embodiment, the plurality of sub-pixel regions 110b are spaced apart by an interval P1 in the extension direction D2 of the second signal line 130. The interval P1 is, for example, a distance between a first signal line 120 to a ground signal line 140 that is the closest to the first signal line 120. Referring to FIGS. 6 and 7, a distance between two first electrodes 172a of two LEDs 172 adjacent to each other and electrically connected with the same ground signal line 140 is P2. P2 is not equal to P1. Two LED chips 170 are adjacent to each other in a direction parallel with the extension direction D2 of the second signal line 130. A distance between two first electrodes 172a that respectively belong to two LED chips 170 and closest to each other is P3. P3 is not equal to P1. More specifically, P2 is not equal to P3 either.

Figure 8:
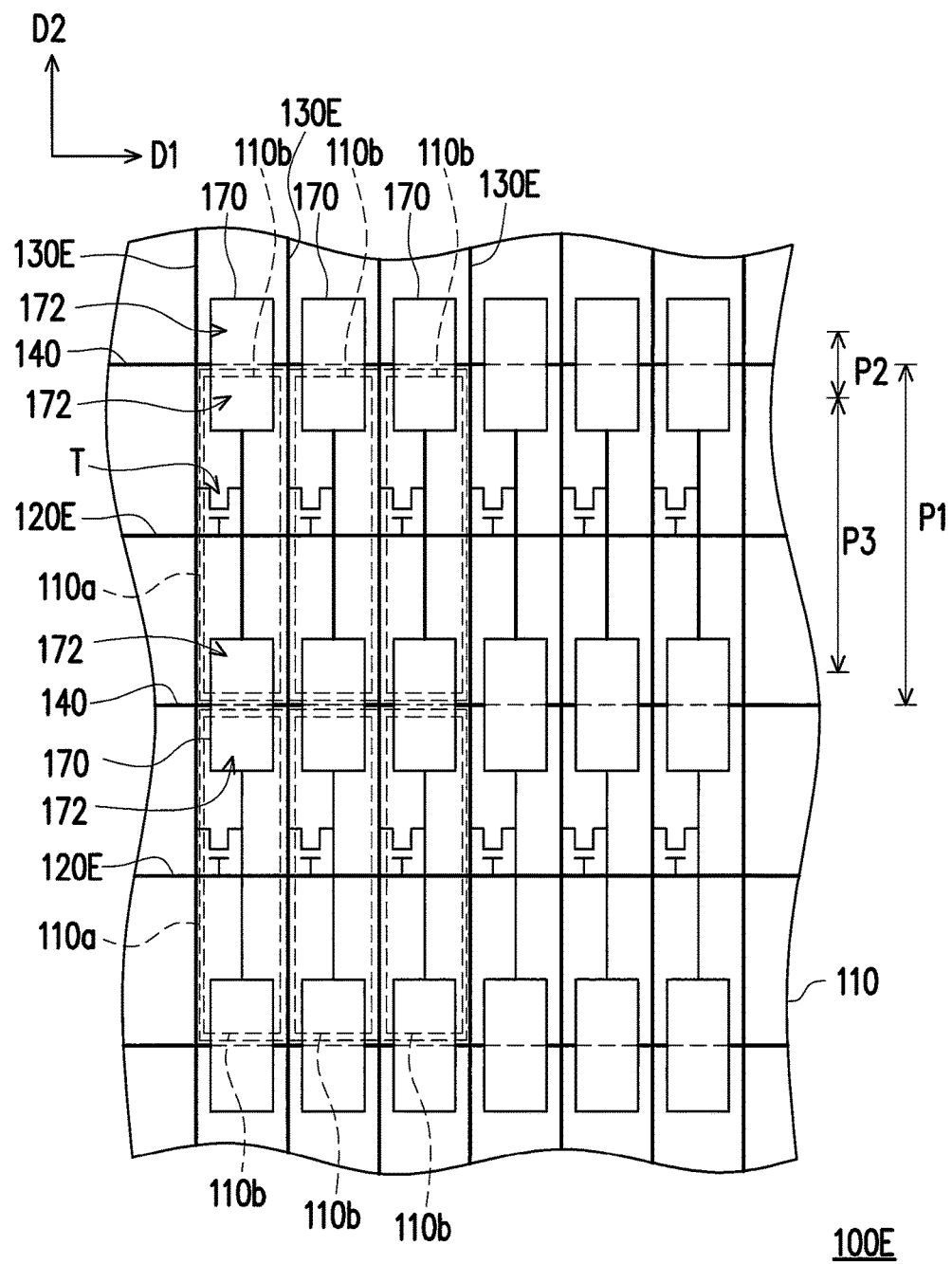
FIG. 8 is a top view of a display apparatus according to another embodiment of the disclosure.

FIG. 8 is a top view of a display apparatus according to another embodiment of the disclosure. A display apparatus 100E in FIG. 8 is similar to the display apparatus 100D in FIG. 6; therefore, identical or corresponding components are denoted by identical or corresponding reference numerals.

The display apparatus 100E includes the substrate 110, the plurality of active elements T, a plurality of first signal lines 120E, a plurality of second signal lines 130E, the plurality of ground signal lines 140 and the plurality of LEDs 172. The substrate 110 has the plurality of pixel regions 110a. In the embodiment, each pixel region 110a may be defined by two second signal lines 130E (e.g. the first second signal line 130E and the fourth second signal line 130E counted from the left side of FIG. 8) and two ground signal lines 140 adjacent to each other. Each pixel region 110a includes a plurality of sub-pixel regions 110b. Each pixel region 110b may be defined by two second signal lines 130E adjacent to each other and two ground signal lines 140 adjacent to each other, which should not be construed as a limitation to the disclosure.

The plurality of active elements T are disposed on the substrate 110. The plurality of first signal lines 120E and the plurality of second signal lines 130E are disposed on the substrate 110 and electrically connected to the plurality of active elements T. The extension direction D1 of each first signal line 120E is different from the extension direction D2 of each second signal line 130E. The plurality of ground signal lines 140 are disposed on the substrate 110 and arranged to be alternated with the first signal line 120E. In the embodiment, the first signal line 120E is, for example, a scan line, and the second signal line 130E is, for example a data line, which should not be construed as a limitation to the disclosure.

Referring to FIGS. 7 and 8, the plurality of LEDs 172 are disposed on the substrate 110. Each LED 172 has the first electrode 172a and the second electrode 172b. The first electrode 172a of each LED 172 is electrically connected with a corresponding active element T. The second electrode 172b of each LED 172 is electrically connected with a corresponding ground signal line 140. The second electrode 172b of at least two LEDs 172 in the same pixel region 110a is electrically connected to the same ground signal line 140 between two first signal lines 120E adjacent to each other.

The difference between the display apparatus 100E and display apparatus 100D is that, in the embodiment, two LEDs 172 in the same LED chip 170 are respectively disposed in two sub-pixel regions 110b adjacent to each other. Two LEDs 172 respectively belong to different LED chips 170 are disposed in the same sub-pixel region 110b corresponding to a single color. To be more specific, two first electrodes 172a of two LEDs 172 respectively belong to different LED chips 170 in the same sub-pixel region 110b may be electrically connected to the same active element T in the same sub-pixel region 110b. With such configuration, when one of the plurality of LEDs 172 disposed in the same sub-pixel region 110b is damaged, another LED 172 may still operate normally such that the display apparatus 100E can continue to serve normal display function.

Referring to FIG. 8, in the embodiment, the plurality of sub-pixel regions 110b are spaced apart by the interval P1 in the extension direction D2 of the second signal line 130E. The interval P1 is, for example, a distance between two ground signal lines 140 adjacent to each other. Referring to FIGS. 7 and 8, the distance between two first electrodes 172a of two LEDs 172 adjacent to each other and electrically connected with the same ground signal line 140 is P2. P2 is not equal to P1. The two LED chips 170 are adjacent to each other in a direction parallel with the extension direction D2 of the second signal line 130E. The distance between two first electrodes 172a that respectively belong to the two LED chips 170 and closest to each other is P3. P3 is not equal to P1. More specifically, P2 is not equal to P3 either.

Figure 9:
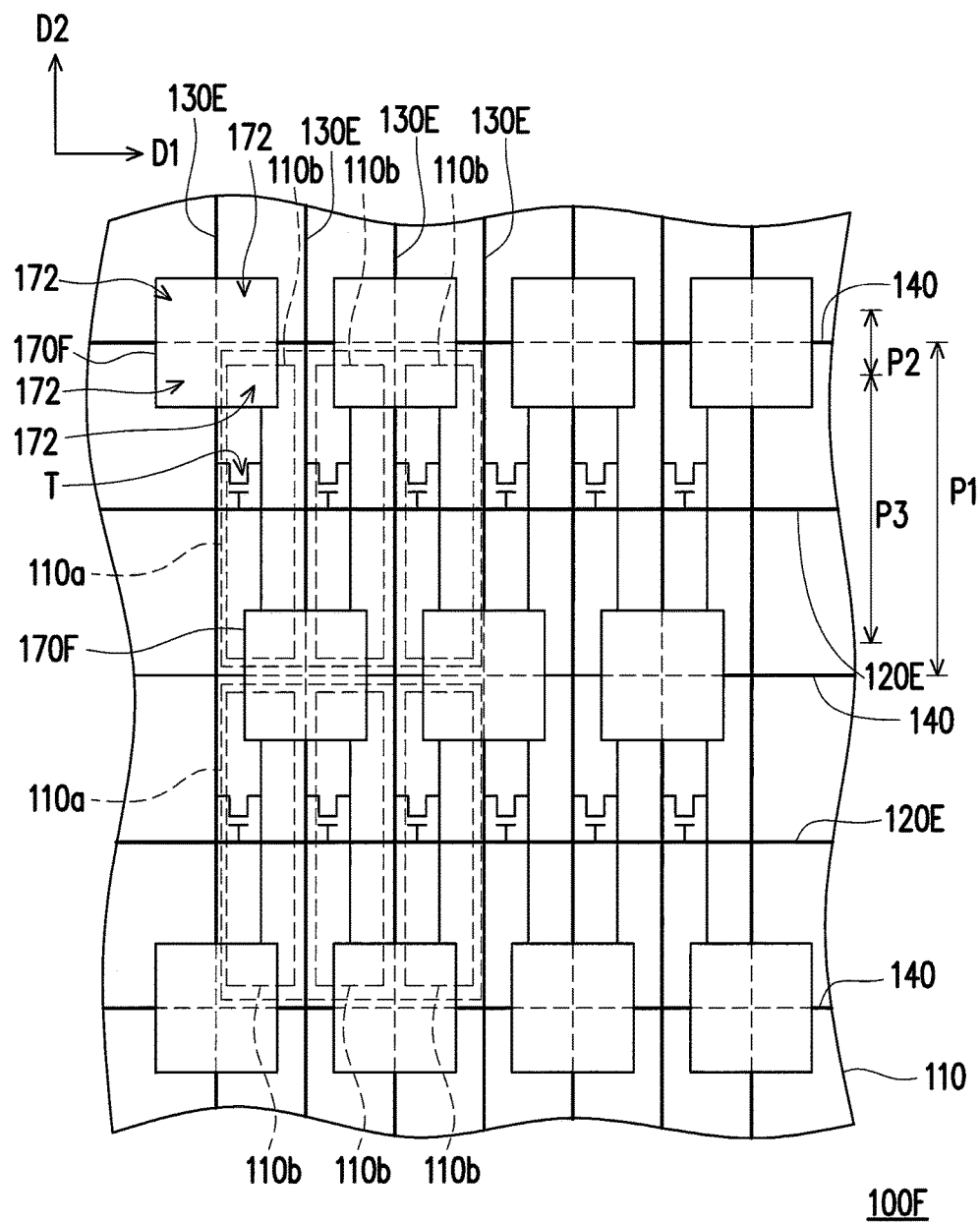
FIG. 9 is a top view of a display apparatus according to yet another embodiment of the disclosure.

FIG. 9 is a top view of a display apparatus according to yet another embodiment of the disclosure. A display apparatus 100F in FIG. 9 is similar to the display apparatus 100E in FIG. 8; therefore, identical or corresponding components are denoted by identical or corresponding reference numerals. The display apparatus 100F includes the substrate 110, the plurality of active elements T, the plurality of first signal lines 120E, the plurality of second signal lines 130E, the plurality of ground signal lines 140 and the plurality of LEDs 172. The substrate 110 has the plurality of pixel regions 110a. The plurality of active elements T are disposed on the substrate 110. The plurality of first signal lines 120E and the plurality of second signal lines 130E are disposed on the substrate 110 and electrically connected with the plurality of active elements T. The extension direction D1 of each first signal line 120E is different from the extension direction D2 of each second signal line 130E. The plurality of ground signal lines 140 are disposed on the substrate 110 and arranged to be alternated with the first signal line 120E.

Figure 10:
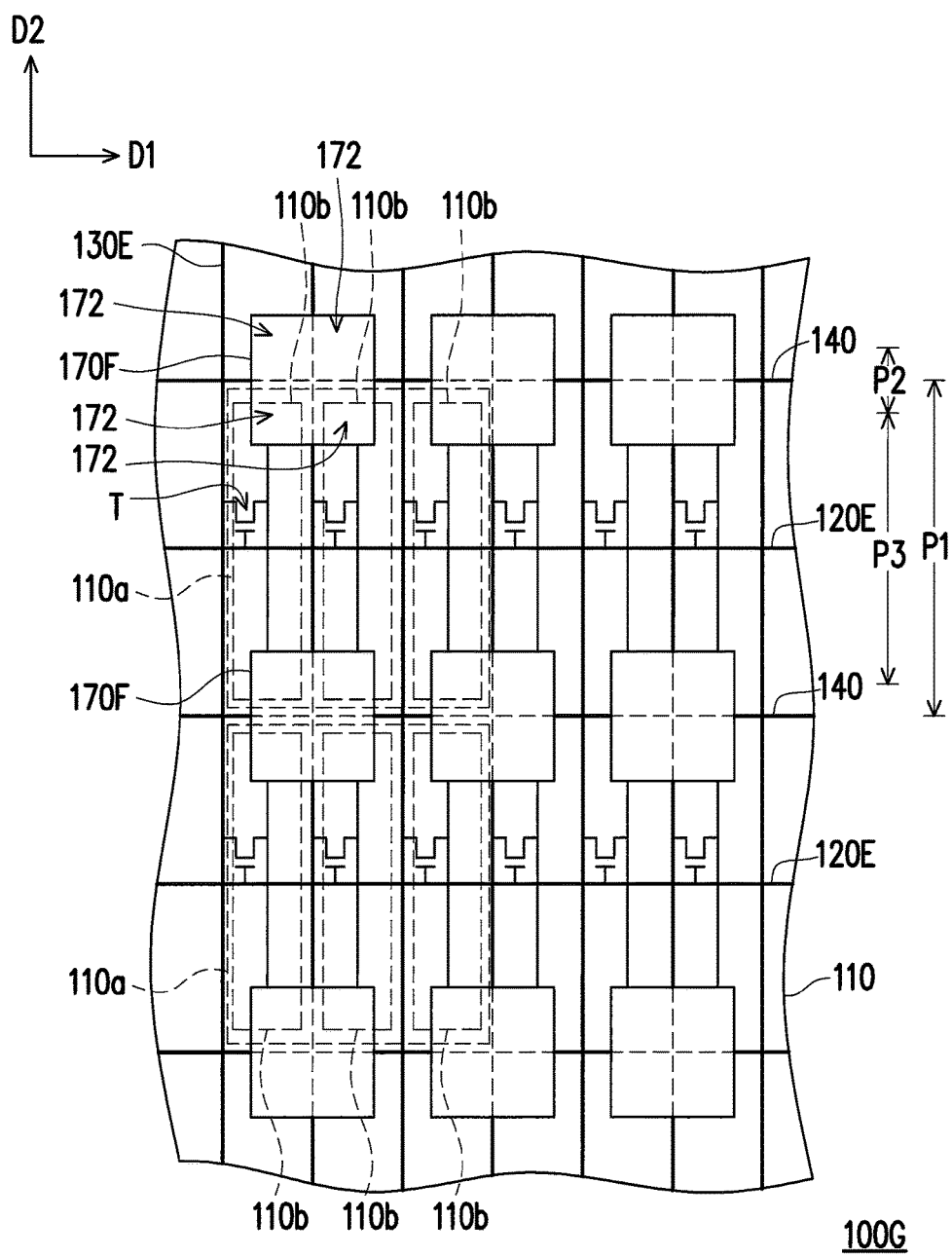
FIG. 10 is a top view of a display apparatus according to yet another embodiment of the disclosure.

Referring to FIGS. 7 and 9, the plurality of LEDs 172 are disposed on the substrate 110. Each LED 172 has the first electrode 172a and the second electrode 172b. The first electrode 172a of each LED 172 is electrically connected with a corresponding active element T. The second electrode 172b of each LED 172 is electrically connected with a corresponding ground signal line 140. The second electrode 172b of at least two LEDs 172 disposed in the same pixel region 110a is electrically connected with the same ground signal line 140 between two first signal lines 120E adjacent to each other. Different from the display apparatus 100D, as shown in FIG. 9, in the embodiment, the same LED chip 170F includes four LEDs 172. The four LEDs 172 may be respectively disposed in four sub-pixel regions 110b which are adjacent to each other. In the embodiment, the plurality of LED chips 170F may be selectively staggered in a direction parallel with the extension direction D2 of the second signal line 130E, which should not be construed as a limitation to the disclosure. FIG. 10 is a top view of a display apparatus according to yet another embodiment of the disclosure. A display apparatus 100G in FIG. 10 is similar to the display apparatus 100F in FIG. 9; therefore, identical or corresponding components are denoted by identical or corresponding reference numerals. In the embodiment of FIG. 10, the plurality of LED chips 170F may be aligned with each other in a direction parallel with the extension direction D2 of the second signal line 130E.

Figure 11:
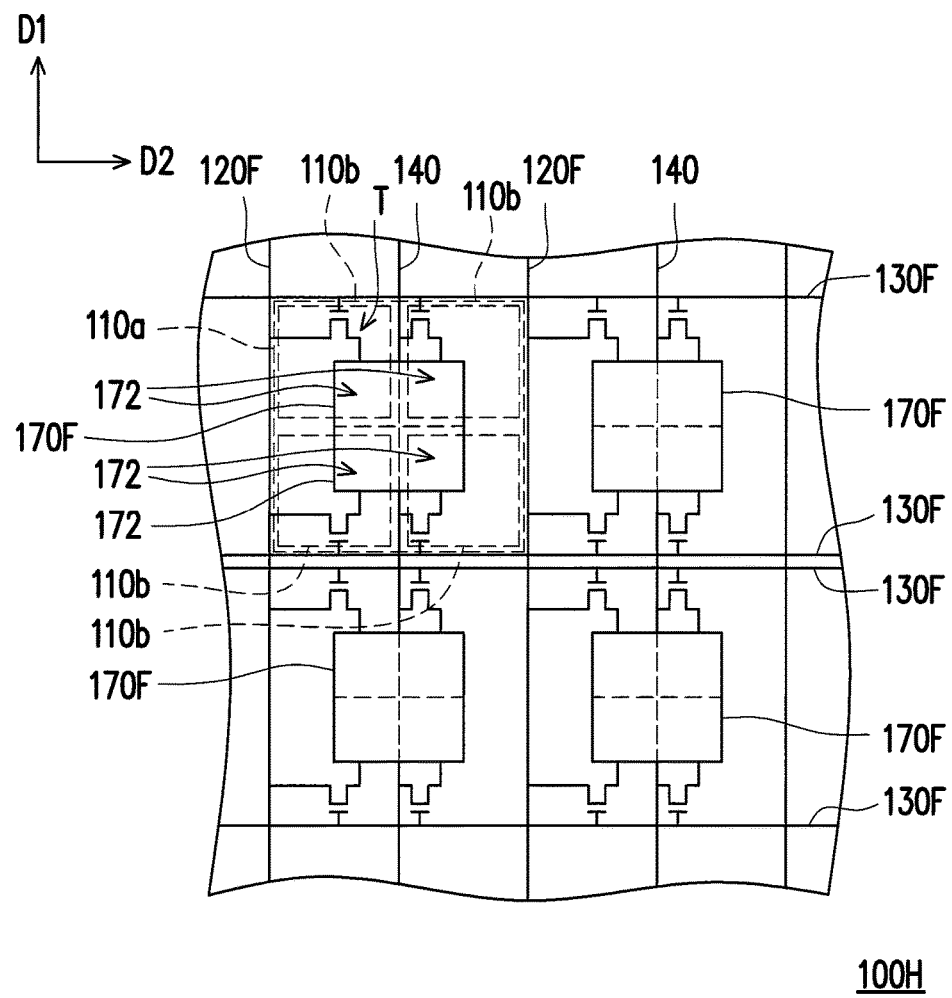
FIG. 11 is a top view of a display apparatus according to an embodiment of the disclosure.

FIG. 11 is a top view of a display apparatus according to an embodiment of the disclosure. A display apparatus 100H in FIG. 11 is similar to the display apparatus 100G in FIG. 10; therefore, identical or corresponding components are denoted by identical or corresponding reference numerals. The display apparatus 100H includes the substrate 110, the plurality of active elements T, a plurality of first signal lines 120F, a plurality of second signal lines 130F, the plurality of ground signal lines 140 and the plurality of LEDs 172. The substrate 110 has the plurality of pixel regions 110a. The plurality of active elements T are disposed on the substrate 110. The plurality of first signal lines 120F and the plurality of second signal lines 130F are disposed on the substrate 110 and electrically connected with the plurality of active elements T. The extension direction D1 of each first signal line 120E is different from the extension direction D2 of each second signal line 130E. The plurality of ground signal lines 140 are disposed on the substrate 110 and arranged to be alternated with the first signal line 120F.

Referring to FIGS. 7 and 11, the plurality of LEDs 172 are disposed on the substrate 110. Each LED 172 has the first electrode 172a and the second electrode 172b. The first electrode 172a of each LED 172 is electrically connected with a corresponding active element T. The second electrode 172b of each LED 172 is electrically connected with a corresponding ground signal line 140. The second electrode 172b of at least two LEDs 172 disposed in the same pixel region 110a is electrically connected with the same ground signal line 140 between two first signal lines 120E adjacent to each other. The same LED chip 170F includes four LEDs 172. The four LEDs 172 may be respectively disposed in four sub-pixel regions 110b which are adjacent to each other. The four sub-pixel regions 110b which are adjacent to each other may selectively correspond to color of red, green, blue and white respectively, which should not be construed as a limitation to the disclosure.

Figure 12:
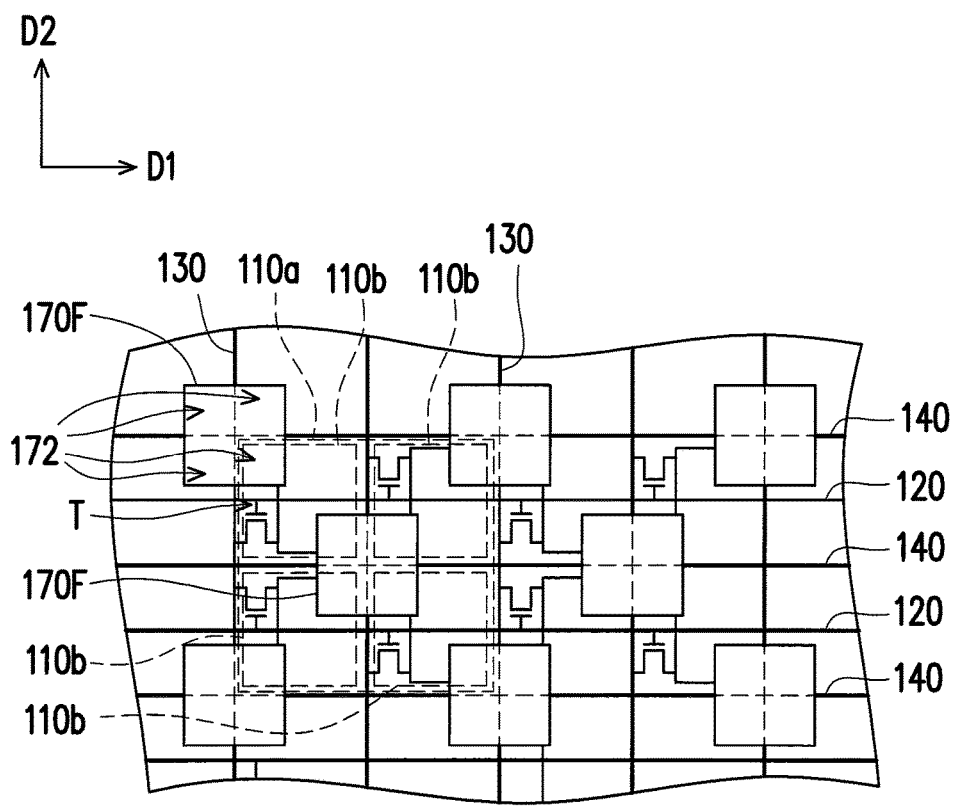
FIG. 12 is a top view of a display apparatus according to another embodiment of the disclosure.

The difference between the display apparatus 100H and display apparatus 100G is that, in the embodiment, an aspect ratio of the sub-pixel region 100b may be 1:1. That is to say, the sub-pixel region 110b may be designed to have a rectangular shape to adapt to the shape of LED chip 170F. In the embodiment, the rectangle is a square shape so that the area of substrate 110 can be used efficiently so that the resolution of display apparatus 100H can be enhanced. In the embodiment, the LED chips 170F may be aligned with each other in a direction parallel with the extension direction D1 of the first signal line 120F, which should not be construed as a limitation to the disclosure. FIG. 12 is a top view of a display apparatus according to yet another embodiment of the disclosure. A display apparatus 100I in FIG. 12 is similar to the display apparatus 100H in FIG. 11; therefore, identical or corresponding components are denoted by identical or corresponding reference numerals. In the embodiment of FIG. 12, the plurality of LED chips 170F may be staggered in a direction parallel with the extension direction D1 of the first signal line 120F. In addition, in the embodiment of FIG. 12, the plurality of LEDs 172 respectively belong to different LED chips 170F are disposed in the same sub-pixel region 110b. With such configuration, when one of the plurality of LEDs 172 disposed in the same sub-pixel region 110b is damaged, another LED 172 may still operate normally such that the display apparatus 100I can continue to serve normal display function.

Figure 13:
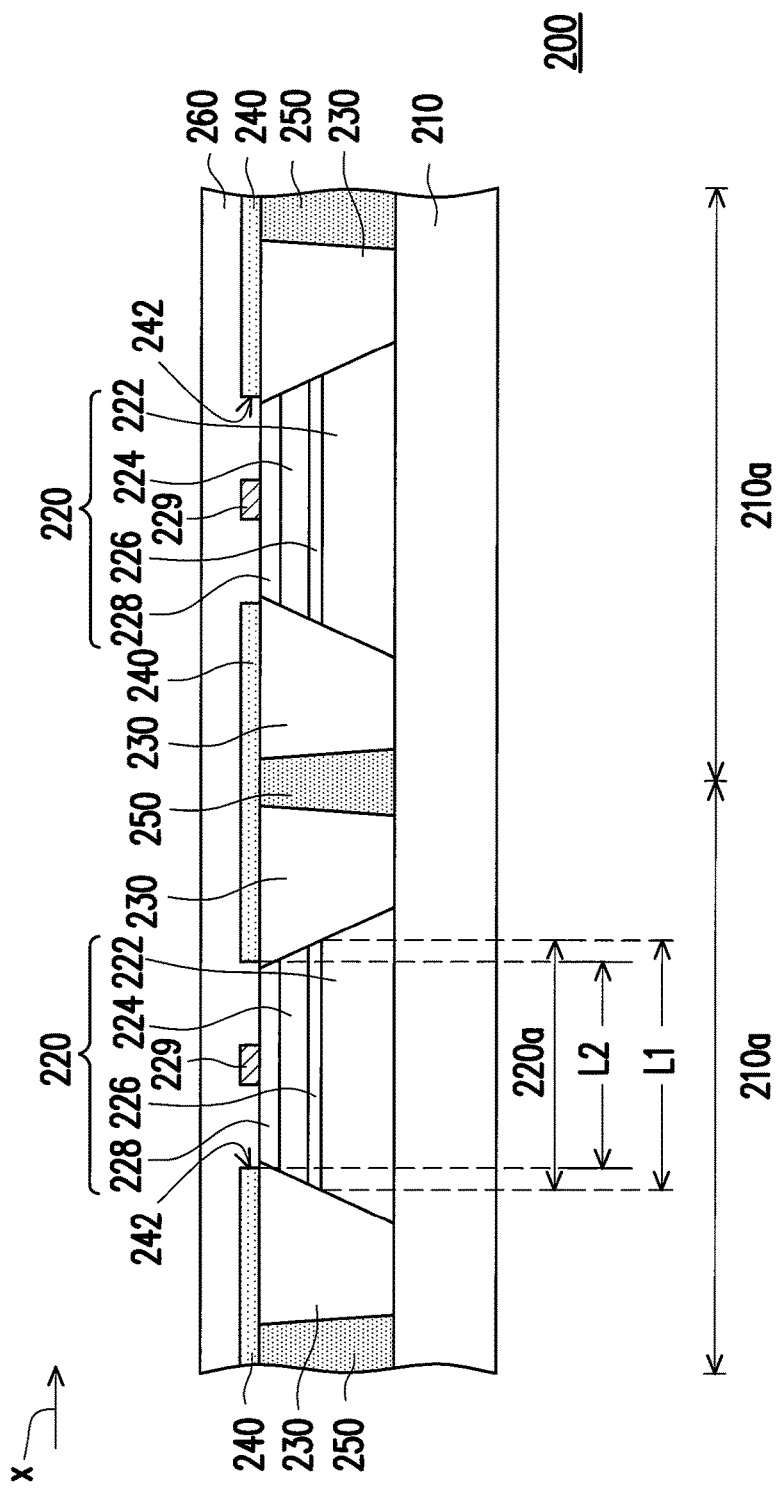
FIG. 13 is a cross-sectional view of a display apparatus according to an embodiment of the disclosure.
Figure 14:
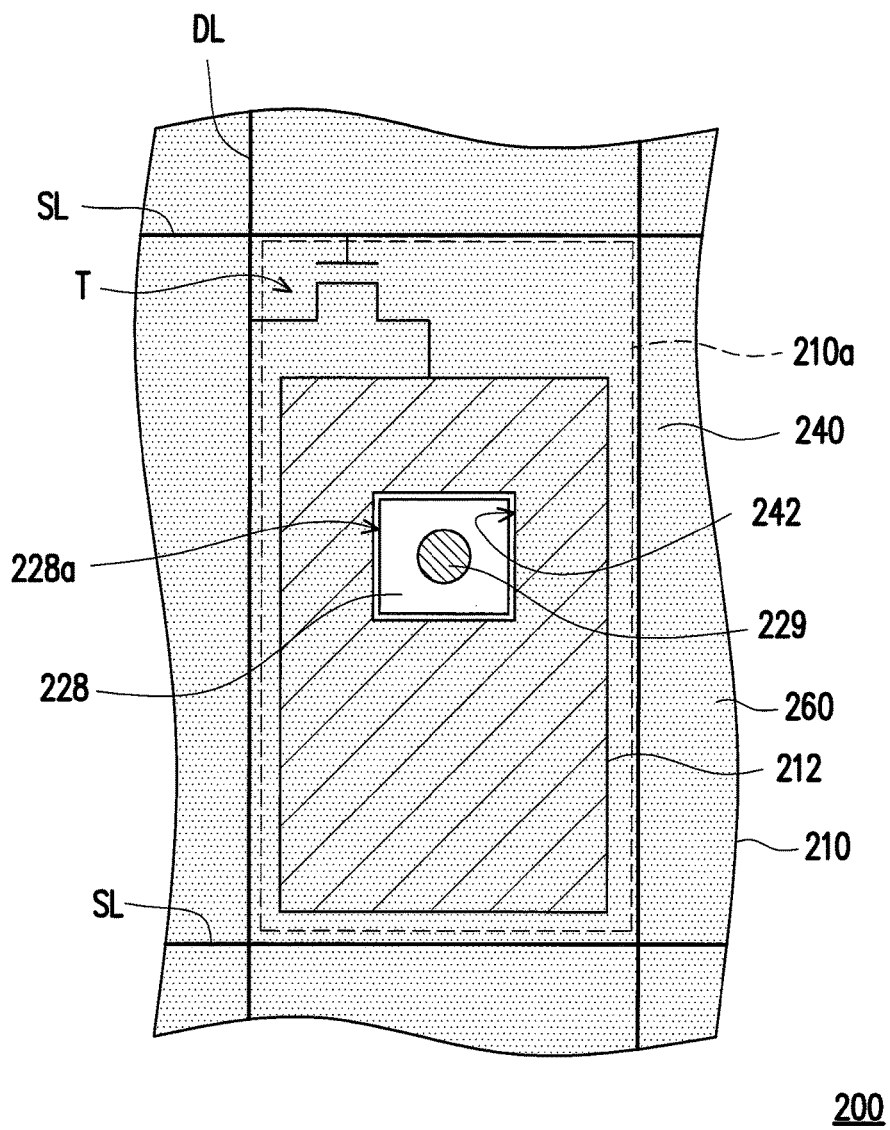
FIG. 14 is a top view of a sub-pixel region of a display apparatus according to an embodiment of the disclosure.

FIG. 13 is a cross-sectional view of a display apparatus according to an embodiment of the disclosure. FIG. 14 is a top view of a sub-pixel region of a display apparatus according to an embodiment of the disclosure. For clarity of illustration, a light blocking structure 250 in FIG. 13 is omitted in FIG. 14. Referring to FIGS. 13 and 14, a display apparatus 200 includes a substrate 210, a plurality of LEDs 220, a first insulation layer 230 and an anti-reflection conductive layer 240. The substrate 210 has a plurality of sub-pixel regions 210a and a plurality of reflective structures disposed in the plurality of sub-pixel regions 210a. In the embodiment, the substrate 210 has the plurality of active elements T, the plurality of data lines DL, the plurality of scan lines SL and a capacitor electrode 212. The active element T is disposed in the sub-pixel region 210a. The active element T includes the thin film transistor. The thin film transistor has the gate, source and drain. The scan line SL is electrically connected with the gate of the thin film transistor. The data line DL is electrically connected with the source of the thin film transistor. The capacitor electrode 212 is electrically connected with the drain of the thin film transistor. The capacitor electrode 212 overlaps the anti-reflection conductive layer 240 to form a storage capacitor. In the embodiment, a reflective structure of the substrate 210 may include the active element T, data line DL, scan line SL, capacitor electrode 212 or a combination thereof, which should not be construed as a limitation to the disclosure. In other embodiments, the reflective structure of the substrate 210 may also refer to other components that have reflective characteristic or a combination of other components and at least one of the active element T, data line DL, scan line SL and capacitor electrode 212.

The plurality of LEDs 220 are disposed on the plurality of sub-pixel regions 210a and electrically connected with the substrate 210. In the embodiment, each LED 220 includes a first semiconductor layer 222, a second semiconductor layer 224, a light emitting layer 226 disposed between the first semiconductor layer 222 and the second semiconductor layer 224 and a transparent electrode 228. The transparent electrode 228 is disposed on the second semiconductor layer 224 and electrically connected with the second semiconductor layer 224. The light emitting layer 226 defines a light emitting region 220a of the LED 220. The first semiconductor layer 222 is electrically connected with the active element T. Specifically, the first semiconductor layer 222 may be electrically connected with the drain of the thin film transistor. In the embodiment, the LED 220 may selectively include a contact pad 229 disposed on the transparent electrode 228, which should not be construed as a limitation to the disclosure. In other embodiments, the LED 220 may be provided without the contact pad 229.

The first insulation layer 230 is filled between the LED 220. To be more specific, in the embodiment, the first insulation layer 230 may cover a side wall of the LED 220 and expose the transparent electrode 228 of the LED 220. The display apparatus 200 may further include a light blocking structure 250. The light blocking structure 250 is configured to prevent that the light emitted from the plurality of LEDs 220 disposed in different sub-pixel regions 210a from interfering with each other. In the embodiment, the light blocking structure 250 is disposed on the active device substrate 210 and may selectively overlap the scan line SL and data line DL, which should not be construed as a limitation to the disclosure. In other embodiments, the light blocking structure 250 may directly cover the side wall of the LED 220 or may be disposed in another suitable position.

The anti-reflection conductive layer 240 is disposed on the first insulation layer 230. The anti-reflection conductive layer 240 has a plurality of openings 242. The opening 242 exposes the light emitting region 220a of the LED 220. The light emitted from the LED 220 may be transmitted to the user's eyes by passing through the anti-reflection conductive layer 240 via the opening 242 to achieve the display effect. The anti-reflection conductive layer 240 blocks the reflective structure of the substrate 210. For example, in the embodiment, the anti-reflection conductive layer 240 may block at least a portion of the region of the capacitor electrode 212 outside the LED 220, the active element T, data line DL and scan line SL, which should not be construed as a limitation to the disclosure. The reflectivity of the anti-reflection conductive layer 240 is lower than the reflectivity of each reflective structure (e.g. capacitor electrode 212, active element T, data line DL, scan line SL or a combination thereof). In the embodiment, the material of the reflective structure of the active device substrate 210 is, for example, a metal having high reflectivity. The anti-reflection conductive layer 240 may be a composite layer having low reflectivity such as a stacked layer comprising at least two of chromium, chromium nitride and chromium oxide or a stacked layer comprising aluminum alloy and AlX—N. The afore-mentioned AlX—N is aluminum nitride or aluminum alloy nitride, which should not be construed as a limitation to the disclosure. The appearance of the anti-reflection conductive layer 240 may be similar to a darkened metal which does not reflect light easily.

It should be noted that since the anti-reflection conductive layer 240 blocks the reflective structure of the substrate 210, most of the light from the outer environment irradiating the display apparatus 200 is blocked by the anti-reflection conductive layer 240 and cannot be easily reflected by the reflective structure of the substrate 210 having high reflectivity. As a result, little amount of light from the outer environment is reflected, and it is not easy to interfere the light emitted by the LED 220 viewed by the user; therefore, the display effect of the display apparatus 200 can be enhanced.

In the embodiment, the anti-reflection conductive layer 240 may selectively not to cover an edge 228a of the transparent electrode 228 of the display apparatus 200, such that most of the light emitted by the LED 220 can pass through the anti-reflection conductive layer 240 for display function, which should not be construed as a limitation to the disclosure. In other embodiments, the anti-reflection conductive layer 240 may cover the edge 228a of the transparent electrode 228.

In the embodiment, the display apparatus 200 may further include a transparent conductive layer 260. The transparent conductive layer 260 is disposed on the first insulation layer 230, covers the sub-pixel region 210a and electrically connected with the plurality of transparent electrodes 228 of the plurality of LEDs 220. Specifically, in the embodiment, the opening 242 of the anti-reflection conductive layer 240 exposes the transparent electrode 228 of the LED 220. The transparent conductive layer 260 covers the anti-reflection conductive layer 240 and is filled in the opening 242 of the anti-reflection conductive layer 240 to be electrically connected with the plurality of transparent electrodes 228 of the plurality of LEDs 220. Briefly, in the embodiment, the anti-reflection conductive layer 240 may selectively not to be electrically in contact with the transparent electrode 228 directly, and the plurality of transparent electrodes 228 of the plurality of display apparatus 200 may be electrically connected with each other via the transparent conductive layer 260.

It should be noted that the transparent conductive layer 260 covers the anti-reflection conductive layer 240 and is electrically connected with the anti-reflection conductive layer 240. In addition, the conductivity of the anti-reflection conductive layer 240 is higher than the conductivity of the transparent conductive layer 260. As compared with a single transparent conductive layer, the ground signal line (i.e. the stacked layer comprising anti-reflection conductive layer 240 and transparent conductive layer 260) shared by the plurality of LEDs 220 has a low resistance and helps to enhance electrical performance of the display apparatus 200, however, the disclosure provides no limitation thereto. In other embodiments, the anti-reflection conductive layer 240 may be adopted to be electrically connected with the plurality of transparent electrodes 228 of the plurality of display apparatus 200 directly without disposing the transparent conductive layer 260. Detailed embodiments are provided below with illustration of accompanying drawings.

Referring to FIG. 13, in the embodiment, the anti-reflection conductive layer 240 may slightly block an edge region of the light emitting layer 226. The light emitting layer 226 of the LED 220 has a width L1 in a direction x. An opening 242 of the anti-reflection conductive layer 240 corresponding to the light emitting layer 226 has a width L2 in the direction x. The width L2 may be greater than a half of the width L1. The width L1 of the light emitting layer 226 is, for example, between 0.5 μm to 500 μm, which should not be construed as a limitation to the disclosure. It depends on actual requirement to determine whether or not the anti-reflection conductive layer 240 is set to block the light emitting layer 226, the relationship between the width L2 and width L1 (alternatively, how much portion of the light emitting layer 226 is blocked by the anti-reflection conductive layer 240), and specific values of the width L2 and width L1.

Figure 15:
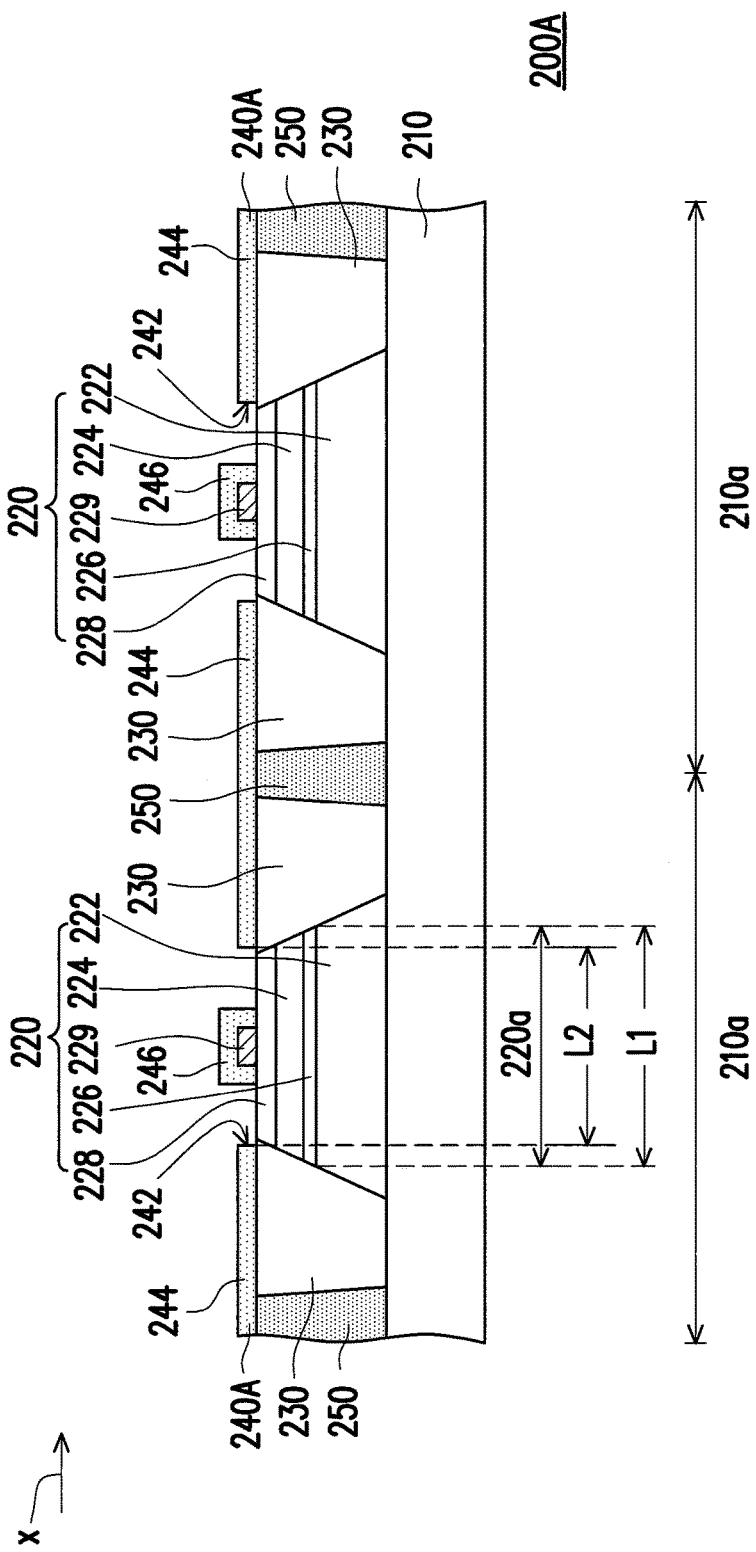
FIG. 15 is a cross-sectional view of a display apparatus according to another embodiment of the disclosure.
Figure 16:
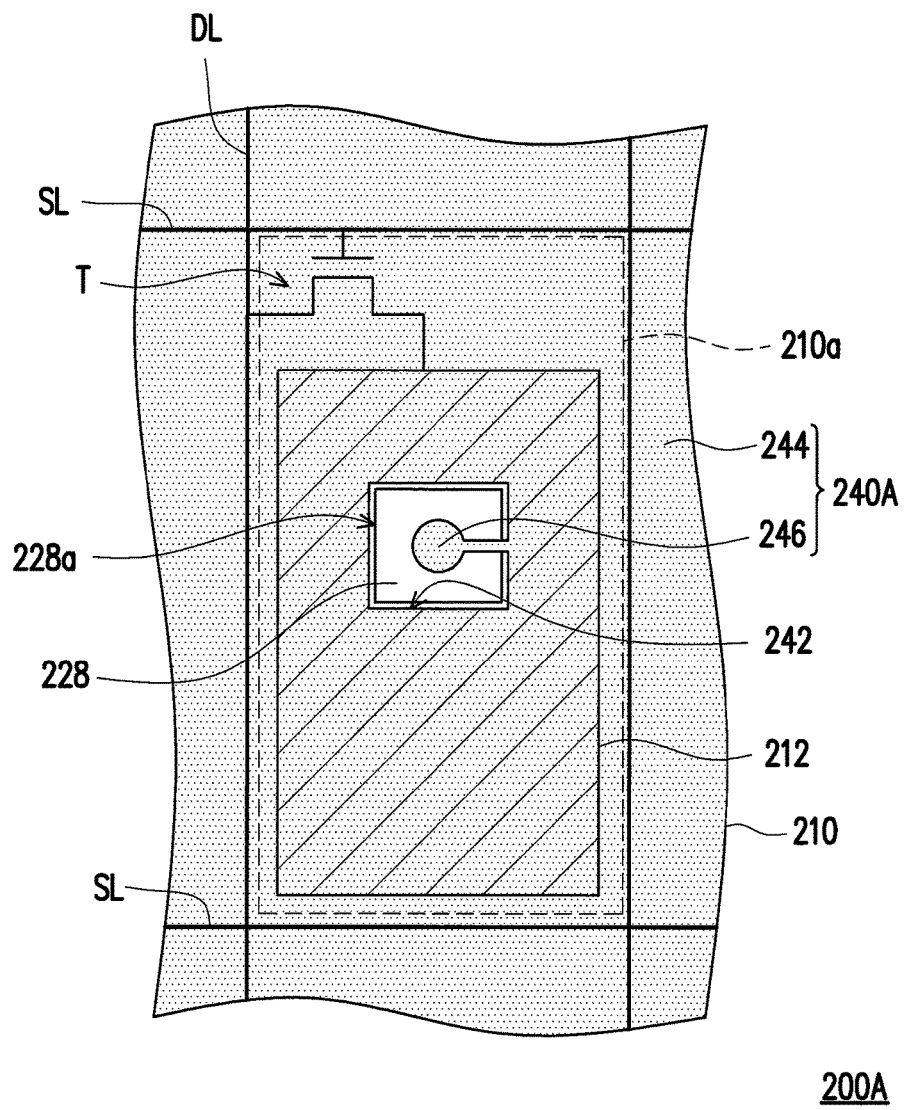
FIG. 16 is a top view of a sub-pixel region of a display apparatus according to yet another embodiment of the disclosure.

FIG. 15 is a cross-sectional view of a display apparatus according to another embodiment of the disclosure. FIG. 16 is a top view of a sub-pixel region of a display apparatus according to yet another embodiment of the disclosure. For clarity of illustration, the light blocking structure 250 in FIG. 15 is omitted in FIG. 16. Referring to FIGS. 15 and 16, a display apparatus 200A is similar to the display apparatus 200; therefore, identical or corresponding components are denoted by identical or corresponding reference numerals. Referring to FIGS. 15 and 16, the display apparatus 200A includes the substrate 210, the plurality of LEDs 220, the first insulation layer 230 and an anti-reflection conductive layer 240A. The substrate 210 has a plurality of sub-pixel regions 210a and the plurality of reflective structures disposed in the sub-pixel regions 210a. The LED 220 is disposed on the sub-pixel region 210a and electrically connected with the substrate 210. The first insulation layer 230 is filled between the LED 220. The anti-reflection conductive layer 240A is disposed on the first insulation layer 230. The reflectivity of the anti-reflection conductive layer 240A is lower than the reflectivity of the reflective structure (e.g. capacitor electrode 212, active element T, data line DL, scan line SL, or a combination thereof) of the substrate 210. The anti-reflection conductive layer 240A blocks the reflective structure of the substrate 210 and has the plurality of openings 242. The opening 242 exposes the light emitting region 220a of the LED 220.

Different from the display apparatus 200, in the embodiment, the plurality of transparent electrodes 228 of the plurality of LEDs 220 are electrically connected with each other directly via the anti-reflection conductive layer 240A without configuration of the transparent conductive layer 260. For example, the anti-reflection conductive layer 240A includes a body portion 244 and an extension portion 246 connected with the body portion. The extension portion 246 is disposed on the transparent electrode 228 of each LED 220 and electrically connected with the transparent electrode 228. The body portion 244 blocks a region outside the plurality of transparent electrodes 228 of the plurality of LEDs 220. The plurality of transparent electrodes 228 of the plurality of LEDs 220 are electrically connected with each other via the extension portion 246 disposed thereon and the body portion 244. The display apparatus 200A has similar effect and advantage as the display apparatus 200; no repetition is incorporated herein.

Figure 17:
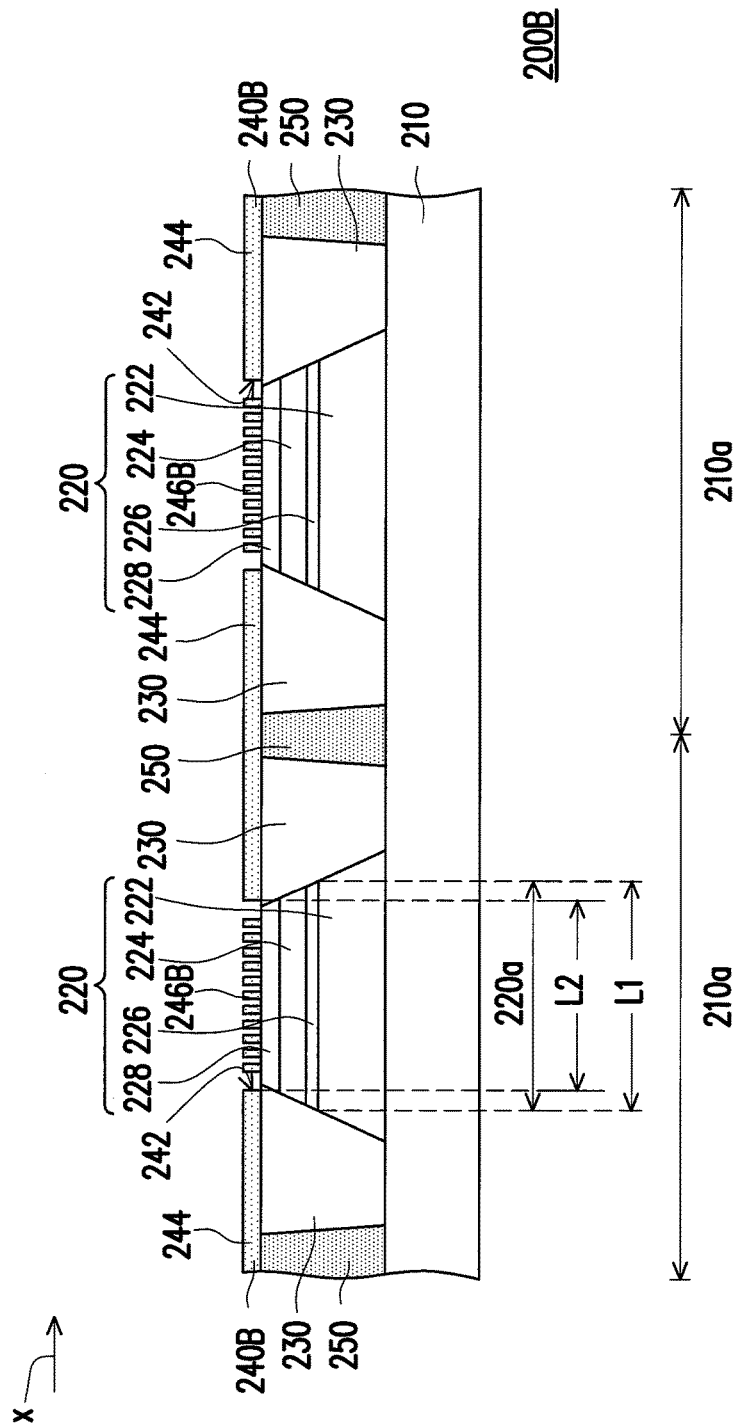
FIG. 17 is a cross-sectional view of a display apparatus according to yet another embodiment of the disclosure.
Figure 18:
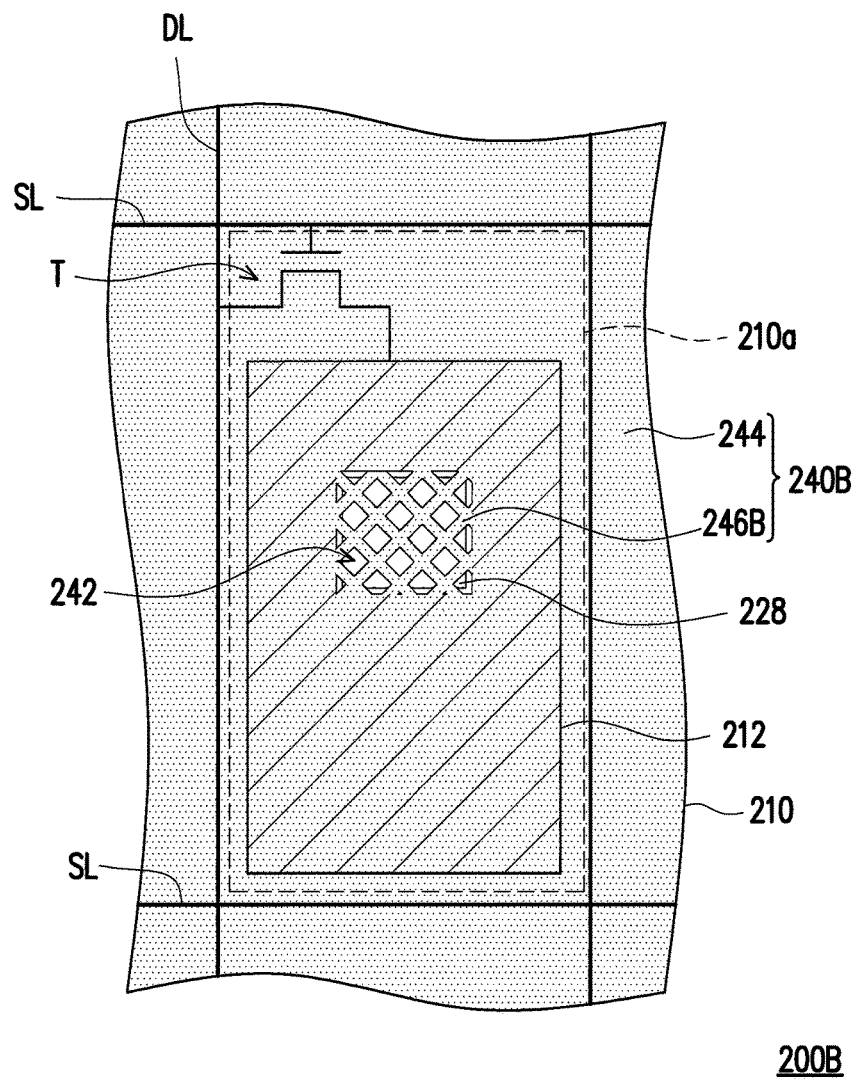
FIG. 18 is a top view of a sub-pixel region of a display apparatus according to yet another embodiment of the disclosure.

FIG. 17 is a cross-sectional view of a display apparatus of another embodiment of the disclosure. FIG. 18 is a top view of a sub-pixel region of a display apparatus of yet another embodiment of the disclosure. For clarity of illustration, the light blocking structure 250 in FIG. 17 is omitted in FIG. 18. Referring to FIGS. 17 and 18, a display apparatus 200B is similar to the display apparatus 200A; therefore, identical or corresponding components are denoted by identical or corresponding reference numerals. Referring to FIGS. 17 and 18, the display apparatus 200B includes the substrate 210, the plurality of LEDs 220, the first insulation layer 230 and an anti-reflection conductive layer 240B. The substrate 210 has a plurality of sub-pixel regions 210a and the plurality of reflective structures disposed in the sub-pixel region 210a. The LED 220 is disposed on the sub-pixel region 210a and electrically connected with the substrate 210. The first insulation layer 230 is filled between the LEDs 220. The anti-reflection conductive layer 240B is disposed on the first insulation layer 230. The reflectivity of the anti-reflection conductive layer 240B is lower than the reflectivity of the reflective structure (e.g. capacitor electrode 212, active element T, data line DL, scan line SL or a combination thereof) of the substrate 210. The anti-reflection conductive layer 240B blocks the reflective structure of the substrate 210 and has the plurality of openings 242. The opening 242 exposes the light emitting region 220a of the LED 220.

Different from the display apparatus 200A, in the embodiment, the anti-reflection conductive layer 240B includes a plurality of mesh structures 246B having the opening 242. Each mesh structure 246B overlaps a corresponding LED 220. The display apparatus 200B uses the mesh structure 246B of the anti-reflection conductive layer 240B to replace the function of the extension portion 246 of the display apparatus 200A. Specifically, the anti-reflection conductive layer 240B includes the body portion 244 and the mesh structure 246B connected with the body portion 244. The mesh structure 246B is disposed on the transparent electrode 228 of each LED 220 and electrically connected with the transparent electrode 228. The body portion 244 blocks a region outside the plurality of transparent electrodes 228 of the plurality of LEDs 220. The plurality of transparent electrodes 228 of the plurality of LEDs 220 are electrically connected with each other via the mesh structure 246B disposed thereon and the body portion 244. The mesh structure 246B of the anti-reflection conductive layer 240B has a plurality of light transmission holes so as not to excessively block the light emitting region 210a of the LEDs 220. The display apparatus 200B has similar effect and advantage as the display apparatus 200; no repetition is incorporated herein.

Figure 19:
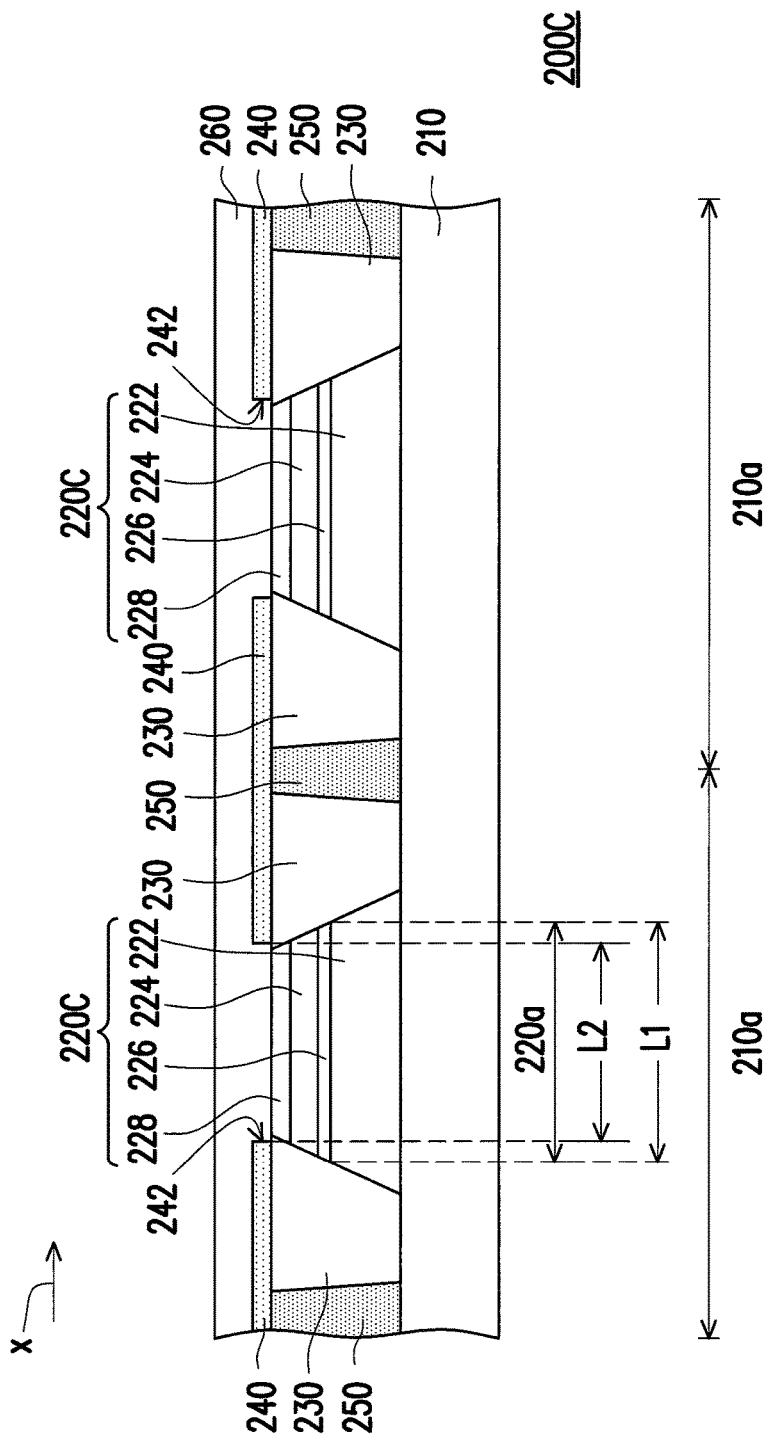
FIG. 19 is cross-sectional view of a display apparatus according to yet another embodiment of the disclosure.
Figure 20:
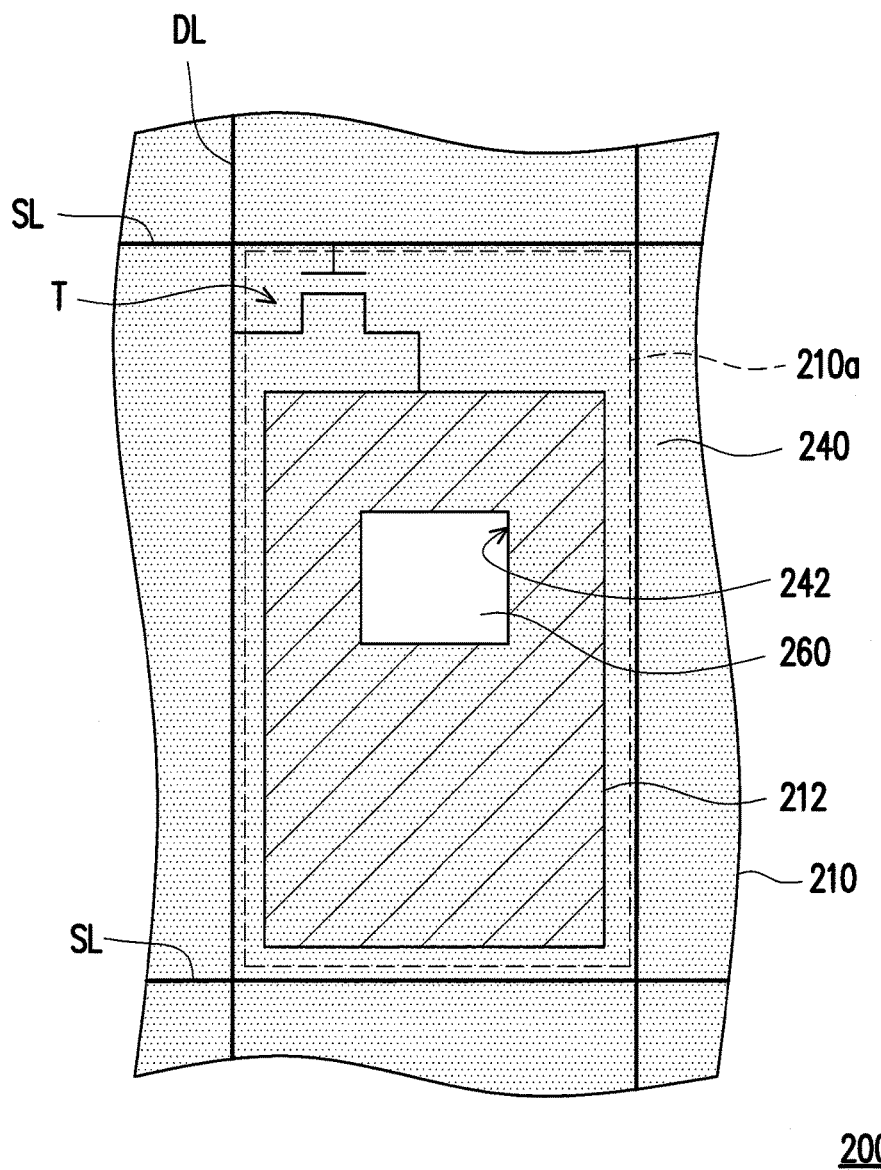
FIG. 20 is a top view of a sub-pixel region of a display apparatus according to yet another embodiment of the disclosure.

FIG. 19 is a cross-sectional view of a display apparatus according to yet another embodiment of the disclosure. FIG. 20 is a top view of a sub-pixel region of a display apparatus of yet another embodiment of the disclosure. For clarity of illustration, the light blocking structure 250 in FIG. 19 is omitted in FIG. 20. Referring to FIGS. 19 and 20, a display apparatus 200C is similar to the display apparatus 200; therefore, identical or corresponding components are denoted by identical or corresponding reference numerals. Referring to FIGS. 19 and 20, the display apparatus 200C includes the substrate 210, a plurality of LEDs 220C, a first insulation layer 230 and an anti-reflection conductive layer 240. The substrate 210 has the plurality of sub-pixel regions 210a and the plurality of reflective structures disposed in the sub-pixel regions 210a. The LED 220C is disposed on the sub-pixel region 210a and electrically connected with the substrate 210. The first insulation layer 230 is filled between the LED 220C. The anti-reflection conductive layer 240 is disposed on the first insulation layer 230. The reflectivity of the anti-reflection conductive layer 240 is lower than the reflectivity of the reflective structure (e.g. capacitor electrode 212, active element T, data line DL, scan line SL or a combination thereof) of the substrate 210. The anti-reflection conductive layer 240 blocks the reflective structure of the substrate 210 and has the plurality of openings 242. The opening 242 exposes the light emitting region 220a of the LED 220.

Different from the display apparatus 200, in the embodiment, the LED 220C may be provided without the contact pad 229 of the LED 220 such that more light can be transmitted to the user's eyes so as to enhance the brightness of the display apparatus 200C. In the meantime, the display apparatus 200C has similar effect and advantage as the display apparatus 200; no repetition is incorporated herein.

Figure 21:
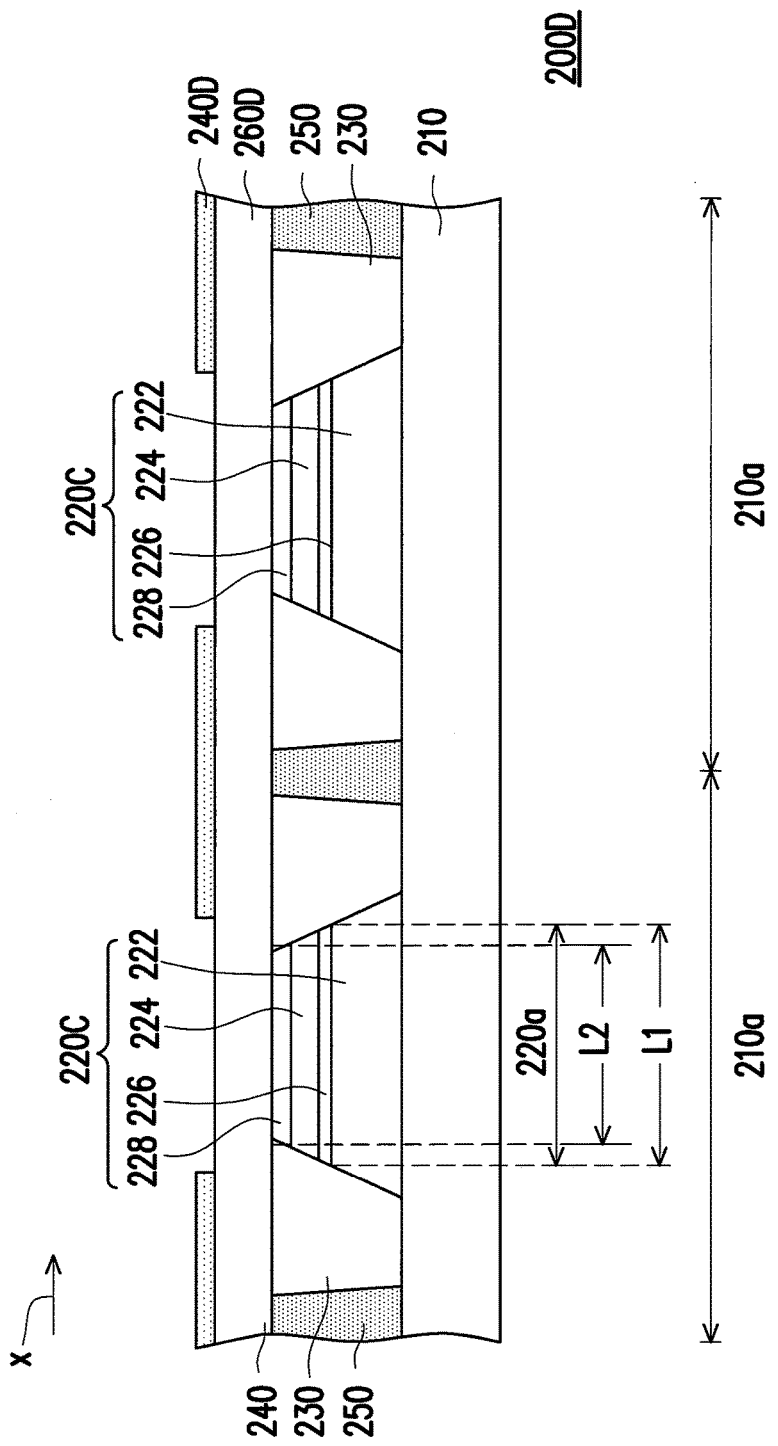
FIG. 21 is a cross-sectional view of a display apparatus according to an embodiment of the disclosure.

FIG. 21 is a cross-sectional view of a display apparatus according to an embodiment of the disclosure. Referring to FIGS. 20 and 21, a display apparatus 200D is similar to the display apparatus 200C; therefore, identical or corresponding components are denoted by identical or corresponding reference numerals. Referring to FIG. 21, the display apparatus 200D includes the substrate 210, the plurality of LEDs 220C, the first insulation layer 230 and an anti-reflection conductive layer 240D. The substrate 210 has the plurality of sub-pixel regions 210a and the plurality of reflective structures disposed in the sub-pixel region 210a. The LED 220C is disposed on the sub-pixel region 210a and electrically connected with the substrate 210. The first insulation layer 230 is filled between the LEDs 220C. The anti-reflection conductive layer 240D is disposed on the first insulation layer 230. The reflectivity of the anti-reflection conductive layer 240D is lower than the reflectivity of the reflective structure (e.g. capacitor electrode 212, active element T, data line DL, scan line SL or a combination thereof) of the substrate 210. The anti-reflection conductive layer 240D blocks the reflective structure of the substrate 210 and has the plurality of openings 242. The opening 242 exposes the light emitting region 220a of the LED 220C.

Different from the display apparatus 200C, in the embodiment, a transparent conductive layer 260D covers the first insulation layer 230 and the transparent electrode 228 of the LED 220C, and the anti-reflection conductive layer 240D is disposed on the transparent conductive layer 260D. In other words, in the embodiment, the transparent conductive layer 260D is used to be electrically connected with the plurality of LEDs 220C first; thereafter, the anti-reflection conductive layer 240D is disposed on the transparent conductive layer 260D and electrically connected with the transparent conductive layer 260D. The display apparatus 200D has similar effect and advantage as the display apparatus 200; no repetition is incorporated herein.

In summary of the above, in the display apparatus according to an embodiment of the disclosure, at least two LEDs disposed in the same pixel region are electrically connected with the same ground signal line between two first signal lines adjacent to each other. Accordingly, the area of the substrate of the display apparatus can be used efficiently so that the resolution of the display apparatus can be enhanced.

In another embodiment of the disclosure, the display apparatus includes the anti-reflection conductive layer. The reflectivity of the anti-reflection conductive layer is lower than the reflectivity of the reflective structure of the active device substrate of the display apparatus. The anti-reflection conductive layer blocks the reflective structure of the substrate. Since the anti-reflection conductive layer blocks the reflective structure of the substrate, most of the light from the outer environment irradiating the display apparatus is blocked by the anti-reflection conductive layer and cannot be easily reflected by the reflective structure of the substrate having high reflectivity. As a result, little amount of light from the outer environment is reflected, and it is not easy to interfere with the light emitted by the LED of the display apparatus viewed by the user, such that the display effect of the display apparatus can be enhanced.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A display apparatus, comprising:
   a substrate, comprising a plurality of sub-pixel regions and a plurality of reflective structures disposed in the plurality of sub-pixel regions;
   a plurality of LEDs, disposed on the plurality of sub-pixel regions and electrically connected with the substrate;
   a first insulation layer, disposed between the plurality of LEDs; and
   an anti-reflection conductive layer, disposed on the first insulation layer, wherein a reflectivity of the anti-reflection conductive layer is lower than a reflectivity of at least one of the reflective structures, the anti-reflection conductive layer blocks the plurality of reflective structures of the substrate and comprises a plurality of openings, the plurality of openings expose a corresponding light emitting region of the LED.

2. The display apparatus according to claim 1, wherein at least one of the LEDs comprises:
   a first semiconductor layer;
   a second semiconductor layer;
   a light emitting layer, disposed between the first semiconductor layer and the second semiconductor layer and defining a light emitting region of at least one of the LEDs; and
   a transparent electrode, electrically connected with the second semiconductor layer, wherein a plurality of first semiconductor layers of the plurality of LEDs are connected with the substrate, and a plurality of transparent electrodes of the plurality of LEDs are electrically connected with each other via the anti-reflection conductive layer.

3. The display apparatus according to claim 1, wherein at least one of the LEDs comprises:
   a first semiconductor layer;
   a second semiconductor layer;
   a light emitting layer, disposed between the first semiconductor layer and the second semiconductor layer and located in a light emitting region of the LED; and
   a transparent electrode, electrically connected with the second semiconductor layer, wherein a plurality of first semiconductor layer of the plurality of LEDs are connected with the substrate, and the display apparatus further comprises:
   a transparent conductive layer, disposed on the first insulation layer, cover the plurality of sub-pixel regions and electrically connected with the plurality of transparent electrodes of the plurality of LEDs.

4. The display apparatus according to claim 3, wherein the plurality of openings of the anti-reflection conductive layer expose the plurality of transparent electrodes of the plurality of LEDs, the transparent conductive layer covers the anti-reflection conductive layer and is filled in the plurality of openings of the anti-reflection conductive layer to be electrically connected with the plurality of transparent electrodes of the plurality of LEDs.

5. The display apparatus according to claim 3, wherein the transparent conductive layer covers the first insulation layer and the plurality of transparent electrodes of the plurality of LEDs, and the anti-reflection conductive layer is disposed on the transparent conductive layer.

6. The display apparatus according to claim 1, wherein at least one of the LEDs comprises a light emitting layer, the light emitting layer has a width in a direction, and an opening of the anti-reflection conductive layer corresponding to the light emitting layer has a width in the one direction, and the width of the opening is greater than a half of the width of the light emitting layer.

7. The display apparatus according to claim 6, wherein the width of the light emitting layer is between 0.5 μm to 500 μm.

8. The display apparatus according to claim 1, wherein the substrate comprises:
   a plurality of active elements, disposed in the plurality of sub-pixel regions and electrically connected with the plurality of LEDs; and
   a plurality of capacitor electrodes, electrically connected with the plurality of active elements respectively, wherein the plurality of reflective structures comprise the plurality of capacitor electrodes, the anti-reflection conductive layer blocks at least a portion of a region of the plurality of capacitor electrodes outside the plurality of LEDs.

9. The display apparatus according to claim 1, wherein the anti-reflection conductive layer is a stacked layer comprising at least two of chromium, chromium nitride and chromium oxide or a stacked layer comprising aluminum alloy and AlX—N, and the AlX—N is aluminum nitride or aluminum alloy nitride.

* * * * *